US012804981B2

(12) United States Patent
Xie et al.

(10) Patent No.: US 12,804,981 B2
(45) Date of Patent: Nov. 17, 2026

(54) INVERTED GATE CUT REGION

(71) Applicant: INTERNATIONAL BUSINESS MACHINES CORPORATION, Armonk, NY (US)

(72) Inventors: Ruilong Xie, Niskayuna, NY (US); Brent A. Anderson, Jericho, VT (US); Lawrence A. Clevenger, Saratoga Springs, NY (US); Albert M. Chu, Nashua, NH (US)

(73) Assignee: International Business Machines Corporation, Armonk, NY (US)

( * ) Notice: Subject to any disclaimer, the term of this patent is extended or adjusted under 35 U.S.C. 154(b) by 443 days.

(21) Appl. No.: 18/333,832

(22) Filed: Jun. 13, 2023

(65) Prior Publication Data

US 2024/0420960 A1 Dec. 19, 2024

(51) Int. Cl.

| | |
|---|---|
| ***H01L 21/28*** | (2025.01) |
| ***H01L 29/06*** | (2006.01) |
| ***H01L 29/417*** | (2006.01) |
| ***H01L 29/423*** | (2006.01) |
| ***H01L 29/66*** | (2006.01) |
| ***H01L 29/775*** | (2006.01) |

(Continued)

(52) U.S. Cl.

CPC ..... *H10D 64/01326* (2026.01); *H10D 30/014* (2025.01); *H10D 30/43* (2025.01); *H10D 30/6729* (2025.01); *H10D 30/6735* (2025.01); *H10D 62/121* (2025.01)

(58) Field of Classification Search

CPC ......... H01L 21/28123; H01L 21/76897; H01L 23/5286; H10D 30/014; H10D 30/43; H10D 30/6729; H10D 30/6735; H10D 62/121; H10D 84/038; H10D 30/0198; H10D 30/501; H10D 30/6757; H10D 64/017; H10D 64/251; H10D 84/0144; H10D 84/832; B82Y 10/00

USPC ........................................................ 257/347

See application file for complete search history.

(56) References Cited

U.S. PATENT DOCUMENTS 8,692,331 B2 4/2014 Okuno
8,947,912 B2 2/2015 Calhoun (Continued)

OTHER PUBLICATIONS

List of IBM Patents or Patent Applications Treated as Related, Jun. 13, 2023, 2 pgs.

*Primary Examiner* — Tong-Ho Kim

(74) *Attorney, Agent, or Firm* — Seed Intellectual Property Law Group LLP

(57) ABSTRACT

A semiconductor IC device includes an inverted gate cut region with a relatively larger bottom surface area compared to its top surface area. As a result, an associated gate structure may have a relatively larger top contact landing surface area relative to its bottom surface area. The increased landing area further enables the frontside contact to be in further perimeter locations. The inverted gate cut region also results in improved resistance characteristics through the gate structure. Specifically, the inverted gate cut region enables a wide region between a top channel and the inverted gate cut region that provides a relatively lower electrical resistance therethrough. Similarly, the inverted gate cut region causes a bottom perimeter region with decreased conductive material therein which advantageously results in lower associated parasitic capacitances.

20 Claims, 16 Drawing Sheets

100

(51) Int. Cl.

| | |
|---|---|
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/01*** | (2025.01) |

(56) References Cited

U.S. PATENT DOCUMENTS

| | | | | |
|---|---|---|---|---|
| 9,048,185 | B2 | 6/2015 | Chiang | |
| 9,547,741 | B2 | 1/2017 | Schroeder | |
| 9,761,495 | B1 | 9/2017 | Xie | |
| 10,008,601 | B2 | 6/2018 | Cheng | |
| 10,176,995 | B1 | 1/2019 | Wu | |
| 10,396,206 | B2 | 8/2019 | Jha | |
| 10,840,147 | B1 | 11/2020 | Li | |
| 10,971,583 | B2 | 4/2021 | Yu | |
| 11,081,356 | B2 | 8/2021 | Wang | |
| 2019/0148373 | A1 | 5/2019 | Shi | |
| 2020/0105613 | A1* | 4/2020 | Hung | H10D 30/608 |
| 2021/0125875 | A1* | 4/2021 | Tsai | H10D 84/038 |
| 2021/0126109 | A1* | 4/2021 | Lin | H10D 30/0243 |
| 2022/0045051 | A1 | 2/2022 | You et al. | |
| 2022/0238388 | A1 | 7/2022 | Hiblot | |
| 2023/0047194 | A1* | 2/2023 | Chen | H10D 30/031 |
| 2024/0096955 | A1* | 3/2024 | Kang | H10D 30/014 |
| 2024/0420959 | A1 | 12/2024 | Xie et al. | |

* cited by examiner

100

100

100

INVERTED GATE CUT REGION

BACKGROUND

Various embodiments of the present disclosure generally relate to semiconductor integrated circuit (IC) device fabrication operations and resulting semiconductor IC devices. More specifically the various embodiments of the present disclosure relate to one or more transistors that are associated with a gate that includes one or more inverted gate cut regions.

Conventional semiconductor IC devices, such as integrated circuits (ICs), or the like, incorporate planar field effect transistors (FETs) in which current flows through a semiconducting channel between a source and a drain, in response to a voltage applied to a control gate. The semiconductor industry strives to obey Moore's law, which holds that each successive generation of integrated circuit devices shrinks to half its size and operates twice as fast. As device dimensions have shrunk, however, conventional silicon device geometries and materials have had trouble maintaining switching speeds without incurring failures such as, for example, leaking current from the device into the semiconductor substrate. Several new technologies emerged that allowed chip designers to continue shrinking transistor sizes.

One particular technology change entailed re-designing the structure of the FET from a planar device to a three-dimensional device in which the semiconducting channel was replaced by a fin that extends out from the plane of the substrate. In such a device, commonly referred to as a FinFET, the control gate wraps around three sides of the fin to influence current flow from three surfaces instead of one. The improved control achieved with a 3D design results in faster switching performance and reduced current leakage. Building taller devices has also permitted increasing the device density within the same footprint that had previously been occupied by a planar FET.

The FinFET concept was further extended by developing a gate all-around FET, or GAA FET, in which the gate fully wraps around one or more channels for maximum control of the current flow therein. In the GAA FET, the channels can take the form of nanowires, nanosheets, or the like, that are isolated from the substrate. In the GAA FET, channel surfaces are in respective contact with the source and drain and other respective channel surfaces are in contact with and surrounded by the gate.

A FET generally is a transistor in which output current, i.e., source-drain current, is controlled by a voltage applied to an associated gate. A FET typically has three terminals, i.e., a gate structure, a source region, and a drain region. A gate structure is a structure used to control output current (i.e., flow of carriers in the channel) of a semiconducting device through electrical or magnetic fields. A channel is the region of the FET underlying the gate structure and between the source and drain of the semiconductor IC device that becomes conductive when the semiconductor device is turned on. The source is a doped region in the semiconductor IC device, in which majority carriers are flowing into the channel. A drain is a doped region in the semiconductor IC device located at the end of the channel, in which carriers are flowing out of the transistor through the drain.

SUMMARY

In an embodiment of the present disclosure, a semiconductor integrated circuit (IC) device is presented. A semiconductor integrated circuit (IC) device includes a gate structure between a first gate spacer and a second gate spacer. The gate structure includes a first gate and a second gate. The semiconductor IC device further includes a backside isolation layer that includes an inverted gate cut region that separates the first gate from the second gate. The inverted gate cut region includes a bottom surface area and a top surface area that is smaller than the bottom surface area. As a result of the inverted gate cut region, the gate structure may have a relatively larger top contact landing surface area relative to its bottom surface area. The relatively larger top contact landing surface area may increase a propensity of a frontside gate contact to meld with the gate structure. The increased landing area further enables the frontside contact to be placed in further perimeter locations. The inverted gate cut region may also result in improved resistance characteristics through the gate structure. Similarly, the inverted gate cut region may cause a bottom perimeter region with decreased conductive material therein which advantageously results in lower associated parasitic capacitances between the gate structures.

In an example, the inverted gate cut region is further located between a first source/drain (S/D) region and a second S/D region. For instance, the inverted gate cut region need not be limited to separating gate structures but can also span multiple device regions or may span multiple transistors may be separate associated regions or structures. As such, by also separating the first S/D region from the second S/D region, the inverted gate cut region may advantageously electrically separate (e.g., electrical noise reduction, or the like) the S/D regions.

In an example, a first transistor is associated with the first gate. The first transistor includes a top channel that is vertically above a bottom channel. By vertically arranging the channels, further scaling of the semiconductor IC device may occur.

In an example, a top dimension between the top channel and the inverted gate cut region is greater than a bottom dimension between the bottom channel and the inverted gate cut region. This dimensional difference caused by the inverted gate cut region may result in improved resistance characteristics through the gate structure. Specifically, a region between the top channel and the inverted gate structure may be wider and have less resistance or impedance therethrough.

In an example, the gate structure is a replacement gate structure. In this way, the inverted gate cut region may be formed after the replacement gate structure has been formed and may separate a first replacement gate, such as a first metal gate from a second replacement gate, such as a first metal gate.

In an example, the semiconductor IC device further includes a backside contact within the backside isolation layer in contact with the first S/D region. As such, the backside isolation layer may be retained upon the backside of the IC device and may be used to form at least a portion of one or more sidewalls of the backside contact.

In an example, the first gate includes a frontside contact landing area that is greater than a bottom surface area of the first gate. This relatively larger top contact landing surface area may increase a propensity of a frontside landing upon an intended gate structure. The increased landing area further enables the frontside contact to be placed in further perimeter locations of the first gate which may ease signal and/or routing complexities.

In another embodiment of the disclosure, a semiconductor IC device is presented. The semiconductor IC device includes a gate structure between a first gate spacer and a second gate spacer. The gate structure includes a first gate and a second gate. The semiconductor IC device further includes a backside isolation layer that includes an inverted gate cut region that separates the first gate from the second gate. The inverted gate cut region includes a bottom dimension and a top dimension that is smaller than the bottom dimension. As a result of the inverted gate cut region, the gate structure may have a relatively larger top contact landing surface area relative to its bottom surface area. The relatively larger top contact landing surface area may increase a propensity of a frontside gate contact to meld with the gate structure. The increased landing area further enables the frontside contact to be placed in further perimeter locations. The inverted gate cut region may also result in improved resistance characteristics through the gate structure. Similarly, the inverted gate cut region may cause a bottom perimeter region with decreased conductive material therein which advantageously results in lower associated parasitic capacitances between the gate structures.

In an example, the inverted gate cut region is further located between a first source/drain (S/D) region and a second S/D region. For instance, the inverted gate cut region need not be limited to separating gate structures but can also span multiple device regions or may span multiple transistors may be separate associated regions or structures. As such, by also separating the first S/D region from the second S/D region, the inverted gate cut region may advantageously electrically separate (e.g., electrical noise reduction, or the like) the S/D regions.

In an example, the semiconductor IC device further includes a first transistor associated with the first gate. The first transistor includes a top channel that is vertically above a bottom channel. By vertically arranging the channels, further scaling of the semiconductor IC device may occur.

In an example, a top distance between the top channel and the inverted gate cut region is greater than a bottom distance between the bottom channel and the inverted gate cut region. This dimensional difference caused by the inverted gate cut region may result in improved resistance characteristics through the gate structure. Specifically, a region between the top channel and the inverted gate structure may be wider and have less resistance or impedance therethrough.

In an example, the gate structure is a replacement gate structure. In this way, the inverted gate cut region may be formed after the replacement gate structure has been formed and may separate a first replacement gate, such as a first metal gate from a second replacement gate, such as a first metal gate.

In an example, the semiconductor IC device further includes a backside contact within the backside isolation layer in contact with the first S/D region. As such, the backside isolation layer may be retained upon the backside of the IC device and may be used to form at least a portion of one or more sidewalls of the backside contact.

In an example, the first gate comprises a frontside contact landing area that is greater than a bottom surface area of the first gate. This relatively larger top contact landing surface area may increase a propensity of a frontside landing upon an intended gate structure. The increased landing area further enables the frontside contact to be placed in further perimeter locations of the first gate which may ease signal and/or routing complexities.

In another embodiment of the disclosure, a method to fabricate a semiconductor integrated circuit (IC) device is presented. The method includes forming a gate structure, forming an inverted gate cut opening by etching, from a backside of the semiconductor IC device, the gate structure, and forming an inverted gate cut region within the inverted gate cut opening. The inverted gate cut region separates the gate structure into a first gate and a second gate. As a result of the inverted gate cut region, the gate structure may have a relatively larger top contact landing surface area relative to its bottom surface area. The relatively larger top contact landing surface area may increase a propensity of a frontside gate contact to meld with the gate structure. The increased landing area further enables the frontside contact to be placed in further perimeter locations. The inverted gate cut region may also result in improved resistance characteristics through the gate structure. Similarly, the inverted gate cut region may cause a bottom perimeter region with decreased conductive material therein which advantageously results in lower associated parasitic capacitances between the gate structures.

In an example, forming the inverted gate cut region within the inverted gate cut opening includes depositing a dielectric material upon a backside of the semiconductor IC device and within the inverted gate cut opening. As such, filling of the inverted gate cut opening may occur from the same side (i.e., backside) of the semiconductor IC device, which may reduce a propensity of the dielectric material to pinch off at an inlet of the inverted gate cut opening preventing the dielectric material from filling the inverted gate cut opening.

In an example, the method further includes forming a first transistor associated with the first gate. The first transistor includes a top channel that is vertically above a bottom channel. By vertically arranging the channels, further scaling of the semiconductor IC device may occur.

In an example, a top distance between the top channel and the inverted gate cut region is greater than a bottom distance between the bottom channel and the inverted gate cut region. This dimensional difference caused by the inverted gate cut region may result in improved resistance characteristics through the gate structure. Specifically, a region between the top channel and the inverted gate structure may be wider and have less resistance or impedance therethrough.

In an example, the gate structure is a replacement gate structure. In this way, the inverted gate cut region may be formed after the replacement gate structure has been formed and may separate a first replacement gate, such as a first metal gate from a second replacement gate, such as a first metal gate.

In an example, the inverted gate cut region is further located between a first source/drain (S/D) region and a second S/D region. For instance, the inverted gate cut region need not be limited to separating gate structures but can also span multiple device regions or may span multiple transistors may be separate associated regions or structures. As such, by also separating the first S/D region from the second S/D region, the inverted gate cut region may advantageously electrically separate (e.g., electrical noise reduction, or the like) the S/D regions.

These and other embodiments, features, aspects, and advantages will become better understood with reference to the following description, appended claims, and accompanying drawings.

DETAILED DESCRIPTION

Figure 1:
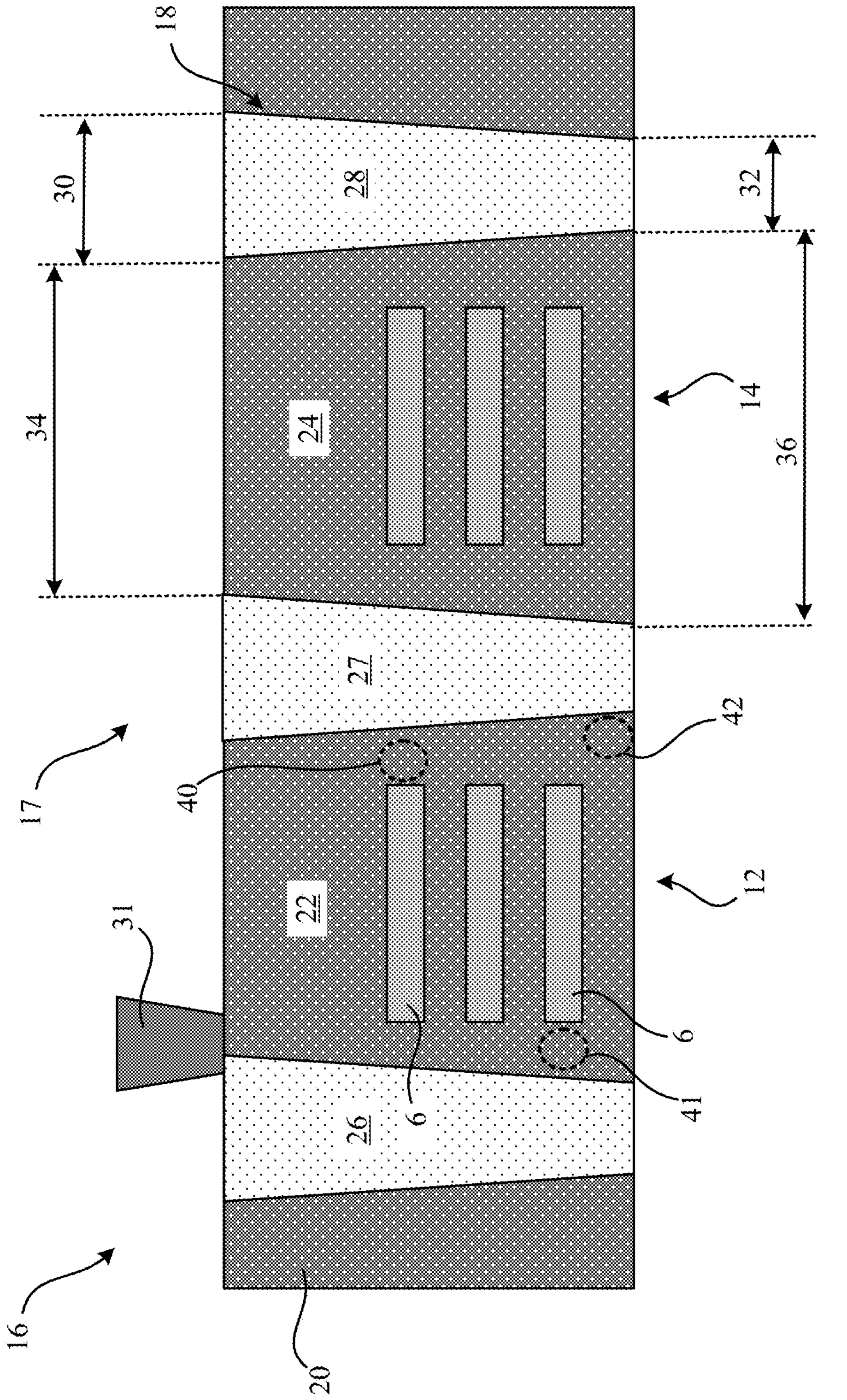
FIG. 1 depicts a gate structure that is separated into distinct gate structures by a gate cut region.

Referring to FIG. 1, which depicts a semiconductor IC device 1, embodiments of the present disclosure recognize that a single gate structure 20 may be separated into electrically distinct gate structures 22, 24 by the formation of one or more gate cut region(s) 26, 27, and/or 28 therewithin. Gate cut regions 26, 27, and/or 28 are typically formed by filling, with a dielectric or other electrically isolating material, a respective gate cut opening 16, 17, and/or 18 that has been formed within the gate structure 20. A gate cut etch typically removes the one or more portion(s) of the gate structure 20, thereby forming the gate cut openings 16, 17, and/or 18. The gate cut opening 17 and the associated gate cut region 27 is located between a first active region 12 and a second active region 14 of the semiconductor IC device 1. The gate cut region 27 may be located within gate structure 20 where isolation between the active regions 12, 14 of the semiconductor IC device 1 is desired. Removing the portion of the gate structure, separating the first active region 12 from the second active region 14, defines two separate gate structures, i.e., a first gate structure 22 associated with the first active region 12, and a second gate structure 24 associated with the second gate structure 24, that are separated by the gate cut region 27.

The gate cut etch is typically a etch from the frontside of the semiconductor IC device 1, such as an anisotropic etch of crystallographic material, or the like, that results in sloped or angled sidewalls of gate cut openings 16, 17, and/or 18 and gate cut regions 26, 27, and/or 28, respectively. In other words, the gate cut etch typically results in trapezoidal orientated gate cut regions 26, 27, and/or 28 that have a larger top (i.e., frontside) dimension 30 compared to a bottom (i.e., backside) dimension 32. As a result, a top dimension 34 of gate structure 22 and of gate structure 24 is typically smaller than a bottom dimension 36 of gate structure 22 and of gate structure 24.

Consequently, trapezoidal orientated gate cut regions typically result in a relatively smaller top surface area of gate structure 22 and of gate structure 24 compared to a bottom surface area of gate structure 22 and of gate structure 24. As the top surface of gate structure 22 and of gate structure 24 is typically a landing area for a frontside gate contact 31, trapezoidal orientated gate cut regions may reduce the landing area of a respective frontside gate contact 31 to the gate structure 22 and to the gate structure 24. Because of the reduced landing area, there is an increased propensity of the frontside gate contact 31 to be misaligned to the underling gate structure 22, as depicted.

Further, trapezoidal orientated gate cut regions typically result in nonoptimal resistance characteristics within the gate structures 22, 24. Specifically, the trapezoidal orientated gate cut regions typically result in a narrow region 40 of the gate structure between a top channel 6 and the gate cut region with a relatively higher electrical resistance therethrough compared to a resistance through a wide region 41 of the gate structure between a bottom channel 8 and the gate cut region. Similarly, the trapezoidal orientated gate cut regions typically result in a bottom perimeter region 42 of surplus metal nearest the gate structure's bottom surface perimeter edge which contributes to parasitic capacitance within the semiconductor IC device 1.

Although this detailed description includes examples of how embodiments of the disclosure can be implemented to form an illustrative semiconductor IC device with GAA FETs, implementation of the teachings recited herein are not necessarily limited to a particular type of FET structure or combination of materials depicted or described. Rather, embodiments of the present disclosure are capable of being implemented in conjunction with other transistor types or materials, now known or later developed, wherein it is desirable for the semiconductor IC device to include a gate structure with an inverted gate cut region, according to one or more disclosed embodiments.

For the sake of brevity, conventional techniques related to semiconductor IC device fabrication may or may not be described in detail herein. Moreover, the various tasks and process steps described herein can be incorporated into a more comprehensive procedure or process having additional steps or functionality not described in detail herein. Various steps in the manufacture of semiconductor IC devices are well known and so, in the interest of brevity, many conventional steps will only be mentioned briefly herein or will be omitted entirely without providing the well-known process details.

In general, the various processes used to form a semiconductor IC device that will be packaged into a final or packaged IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., polysilicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

As used herein, the terms "selective" or "selectively" in reference to a material removal or etch process denote that the rate of material removal for a first material is greater than the rate of removal for at least another material of the structure to which the material removal process is applied. For example, in certain embodiments, a selective etch may include an etch chemistry that removes a first material selectively to a second material by a ratio of 2:1 or greater, e.g., 5:1, 10:1 or 20:1.

Turning now to a description of technologies that are more specifically relevant to the present disclosure, transistors are a type of microdevice commonly found in a wide variety of semiconductor IC devices. Typical semiconductor IC devices may be formed using or within active regions of a wafer. The active regions are defined by isolation regions used to separate and electrically isolate the adjacent active regions.

An illustrative semiconductor IC device depicted herein includes a plurality of GAA FETs. Each GAA FET has a source and a drain that are formed in an active region of a semiconductor layer by implanting n-type or p-type impurities in the respective source and the drain material. Disposed between the source and the drain is a channel, or body region, hereinafter referred to as a channel. Disposed around the channel is the gate structure. The gate structure, the source, and the gate and the drain are spaced apart by a dielectric layer or spacer.

The illustrative GAA FETs may be fabricated using so-called complementary metal oxide semiconductor (CMOS) fabrication technologies. In general, CMOS is a technology that uses complementary and symmetrical pairs of p-type and n-type MOSFETs to implement logic functions. The channel connects the source and the drain, and electrical current flows through the channel region from the source to the drain. The electrical current flow is induced in the channel region by a voltage applied at the gate structure.

The wafer footprint of a GAA FET is related to the electrical conductivity of the channel material. If the channel material has a relatively high conductivity, the GAA FET can be made with a correspondingly smaller wafer footprint. A known method of increasing channel conductivity and decreasing GAA FET size is to form the channel as a one or more nanolayers, such as nanowires, or nanosheets. These GAA FETs provide a relatively small FET footprint by forming the channel as a series of vertical nanolayers.

In a known GAA configuration, a nanolayer-based FET includes a source region, a drain region, and stacked nanolayer channels between the source and drain regions. A gate surrounds the stacked nanolayer channels and regulates electron and hole flow through the nanolayer channels between the source and drain regions. GAA FETs may be fabricated by forming alternating layers of channel nanolayer and sacrificial nanolayer layers. The sacrificial nanolayer layers are released from the channel nanolayers before the GAA FET device is finalized. For n-type GAA FETs, the channel nanolayer layers may be silicon (Si) and the sacrificial nanolayer layers may be silicon germanium (SiGe). For p-type GAA FETs, in some implementations, the channel nanolayer layers may be SiGe and the sacrificial nanolayer layers may be Si. In other implementations, p-type GAA FETs, the channel nanolayer may be Si, and the sacrificial nanolayer can be SiGe. In some implementations, the channel nanolayer layers may initially be Si and can be converted to SiGe or other material, after sacrificial nanolayer layers are removed.

Turning now to a more detailed description of fabrication operations and resulting structures according to embodiments of the disclosure, FIG. 2 through FIG. 13 depict a semiconductor IC device that includes, or is to include, a gate structure with an inverted gate cut region therein, after various fabrication operations. For ease of illustration, the fabrication operations depicted therein will be described in the context of forming elements of GAA FET(s). The cross-sectional structural diagrams depicted in the drawings are two-dimensional, through the semiconductor IC devices is a three-dimensional device. The depicted cross-sectional planes are chosen to best show the features of the semiconductor IC device. For example, an X cross-sectional view, a Y cross-sectional view, and a Z cross-sectional view are defined upon a partial top-view of the semiconductor IC device. The illustrative X cross-sectional view is a vertical cross-section through an active region 121 across neighboring gates 123, the illustrative Y cross-sectional view is a vertical cross-section through a gate 123 across neighboring active regions 121, and the illustrative Z cross-sectional view is a vertical cross-section across neighboring active regions 121 and between neighboring gates 123. Gates 123 are either sacrificial gate structures or replacement gate structures, as appropriate, and may be depicted as dashed lines as a location placeholder if no sacrificial gate structures or replacement gate structures have been formed.

For clarity, the illustrative fabrication stages depicted in FIG. 2 through FIG. 13 may be used to fabricate the various semiconductor IC devices depicted and described herein. For example, the fabrication stages depicted in FIG. 2 through FIG. 13 may be used to fabricate semiconductor IC device 100 that includes a gate structure with an inverted gate cut region therein using backside etch process where the inverted gate cut region is formed with an etch from the backside of the semiconductor IC device 100.

Figure 2:
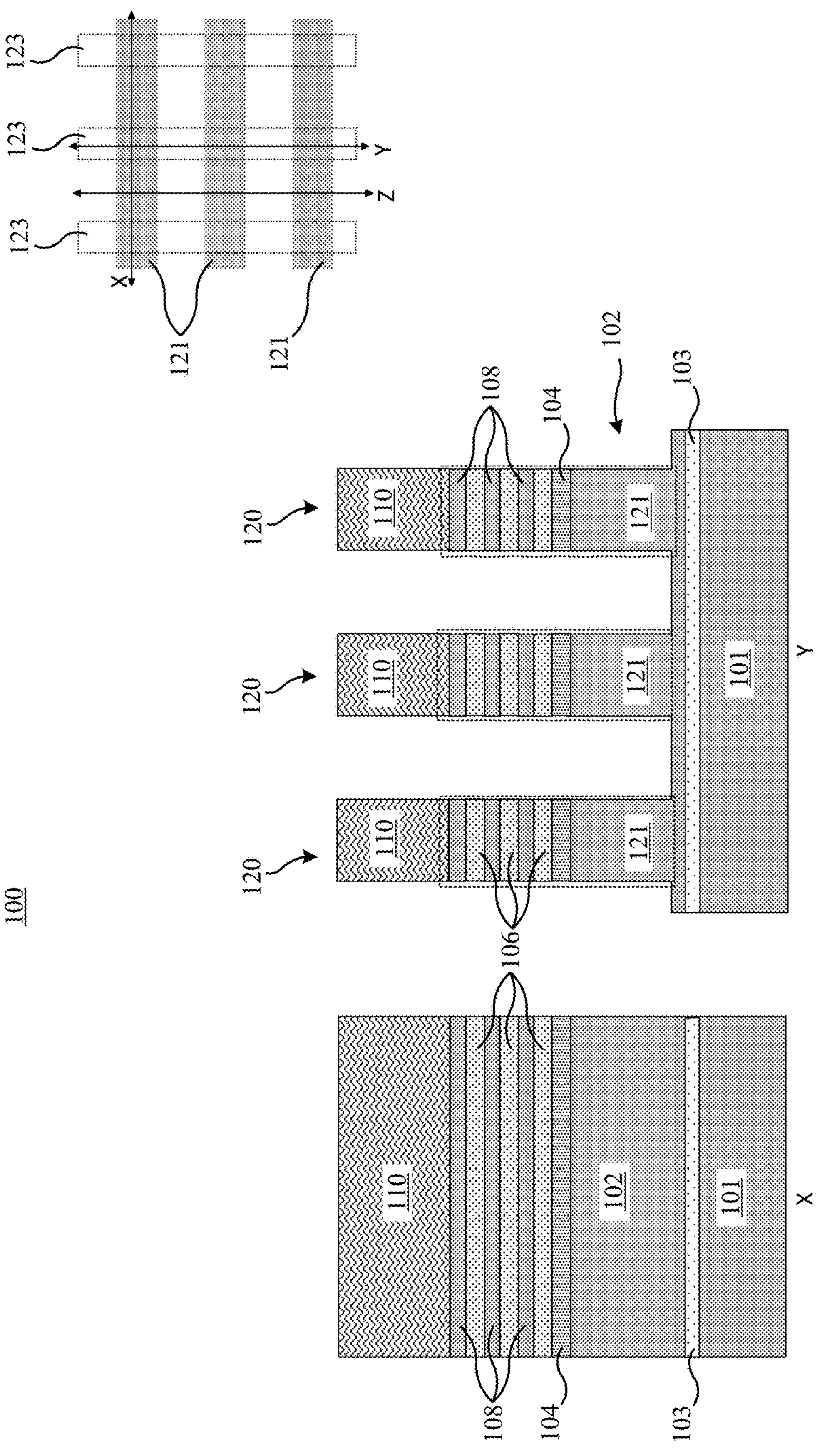
FIG. 2 through FIG. 13 depict fabrication stage views of a semiconductor IC device that includes a gate structure that is separated into distinct gate structures by an inverted gate cut region, in accordance with one or more embodiments of the disclosure.

FIG. 2 depicts cross-sectional views of the semiconductor IC device 100 after initial fabrication operations, in accordance with embodiments of the present disclosure. In the present fabrication stage, one or more nanolayers are formed upon a substrate. Further in the depicted fabrication stage, one or more nanolayer stack(s) 120 are patterned.

The substrate may include a multilayered substrate that includes an upper substrate 102 and a lower substrate 101. When the substrate is multilayered, an etch stop layer 103 may be located between the upper substrate 102 and the lower substrate 101. The etch stop layer 103 is generally formed of a material with etch selectivity to upper substrate 102 and/or lower substrate 101. Non-limiting examples of suitable materials for the upper substrate 102 and/or lower substrate 101 include Si (silicon), strained Si, SiC (silicon carbide), Ge (germanium), SiGe (silicon germanium), SiGe:C (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb). Non-limiting examples of suitable materials for the etch stop layer 103 include SiGe, $SiO_2$, etc.

Nanolayers may be formed by initially fabricating a sacrificial nanolayer 104 upon substrate 102. Further nanolayers may be formed by fabricating an alternating series of sacrificial nanolayers 106, such as SiGe sacrificial nanolayers, and active nanolayers 108, such as Si nanolayers, upon the sacrificial nanolayer 104. The sacrificial nanolayers 106 can have Ge % ranging from about 20% to about 45%. In an implementation, the sacrificial nanolayer 104 may be epitaxially grown from the substrate 102 and the alternating active sacrificial nanolayer 106 and active nanolayer 108 may be formed by epitaxially growing one layer and then the next until the desired number and desired thicknesses of the layers are achieved. Any number of alternating nanolayers can be provided. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a (100) orientated crystalline surface will take on a (100) orientation. In some embodiments, epitaxial growth and/or deposition processes are selective to forming on semiconductor surfaces, and generally do not deposit material on exposed surfaces, such as silicon dioxide or silicon nitride surfaces.

In some embodiments of the disclosure, the active nanolayers 108 are formed from Si and can include, for example, monocrystalline Si. The active nanolayers 108 can have a thickness of, for example, from about 4 to about 12 nm. In embodiments the sacrificial nanolayers 106 are formed from SiGe and the sacrificial nanolayers 106 can have a thickness of, for example, from about 4 to about 12 nm. The sacrificial nanolayers 106 can have Ge % ranging from about 20% to about 45%. The sacrificial nanolayer 104 may be formed by epitaxially growing a SiGe layer with high Ge %, ranging from about 50% to about 70%. The sacrificial nanolayer 104 can have a thickness of, for example, from about 4 to about 15 nm.

A mask layer 110 that may be used to pattern the nanolayers into nanolayer stacks 120 may be initially formed upon the top nanolayer. The mask layer 110 may be patterned by photolithography which resultantly exposes portions of the underlying top nanolayer while protecting other portions of the underlying nanolayers.

The nanolayer stacks 120 may be patterned by removing respective undesired portion(s) or section(s) of the sacrificial nanolayer 104, sacrificial nanolayers 106, and active nanolayers 108 while retaining respective desired portions thereof. The removal of undesired portions of the sacrificial nanolayer 104, sacrificial nanolayers 106, and active nanolayers 108 can be accomplished using, for example, lithography and etch processes using the mask layer 110 as a protective mask. The removal of such undesired portions may further remove undesired portions of upper substrate 102 that are adjacent to respective footprints of nanolayer stacks 120. The desired portions of the sacrificial nanolayer 104, sacrificial nanolayers 106, and active nanolayers 108 may be protected by the patterned mask layer 110 and resultingly form the nanolayer stacks 120.

Figure 3:
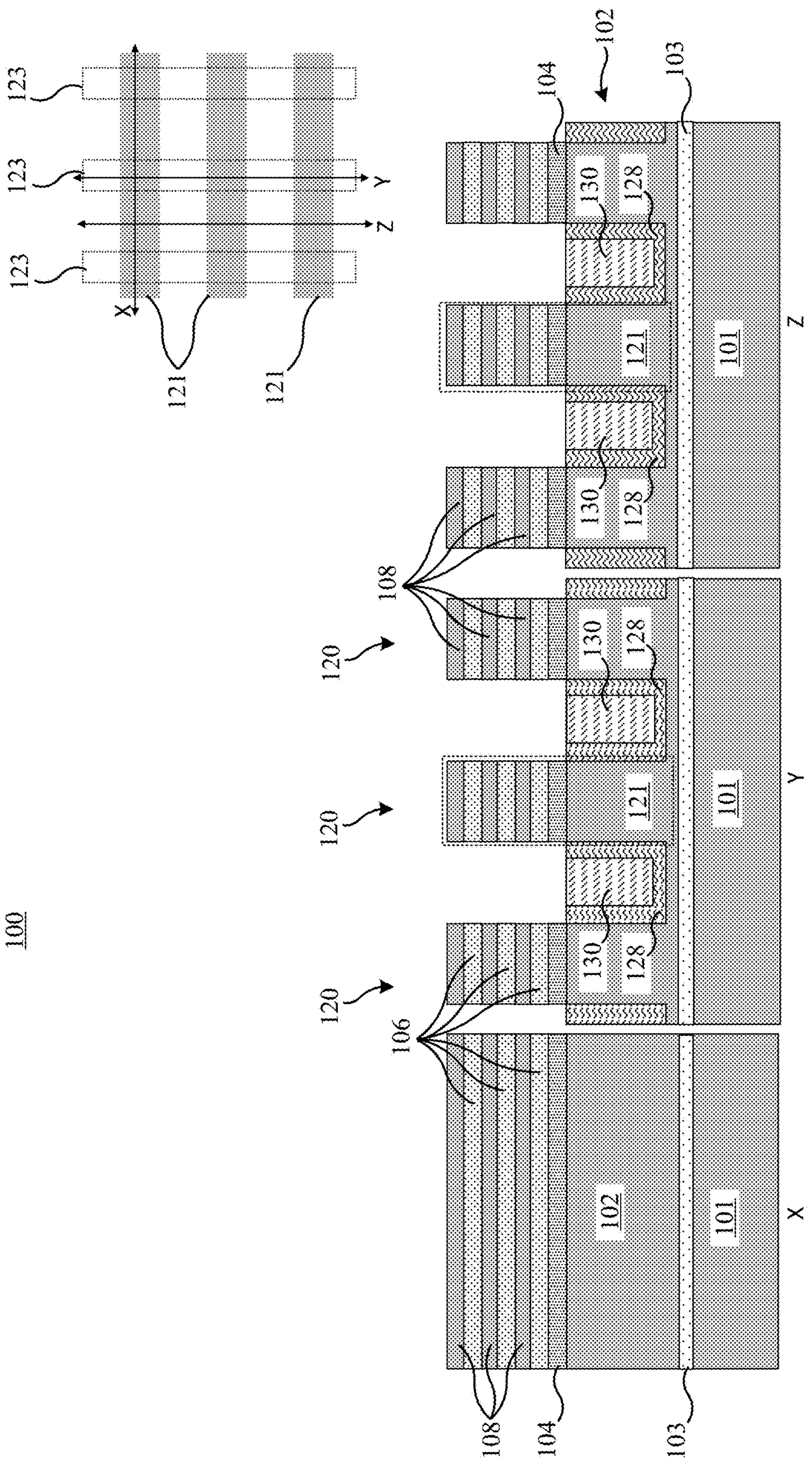

FIG. 3 depicts cross-sectional views of the semiconductor IC device 100 after fabrication operations, in accordance with embodiments of the present disclosure. In the present fabrication stage, shallow trench isolation (STI) region(s) may be formed within the upper substrate 102 next to nanolayer stacks 120 to separate the active regions 121.

Further in the present fabrication stage, STI region(s) may be formed upon the recessed upper substrate 102 adjacent to respective footprints of nanolayer stacks 120. In the embodiment depicted, a top surface of one or more STI region(s) may be coplanar with a top surface of upper substrate 102. STI region(s) may be formed by depositing an STI liner 128 upon the recessed upper substrate 102. Subsequently, STI region(s) may be further formed by depositing STI dielectric material 130 upon the STI liner 128. A STI liner 128 and/or STI dielectric material 130 etch back, recess, or the like, may occur to remove undesired or over formed STI liner 128 and/or STI dielectric material 130. The STI region(s) may electrically isolate or at least partially electrically separate components or features of neighboring devices, or the like. For example, STI region(s) may separate neighboring active regions 121.

Figure 4:
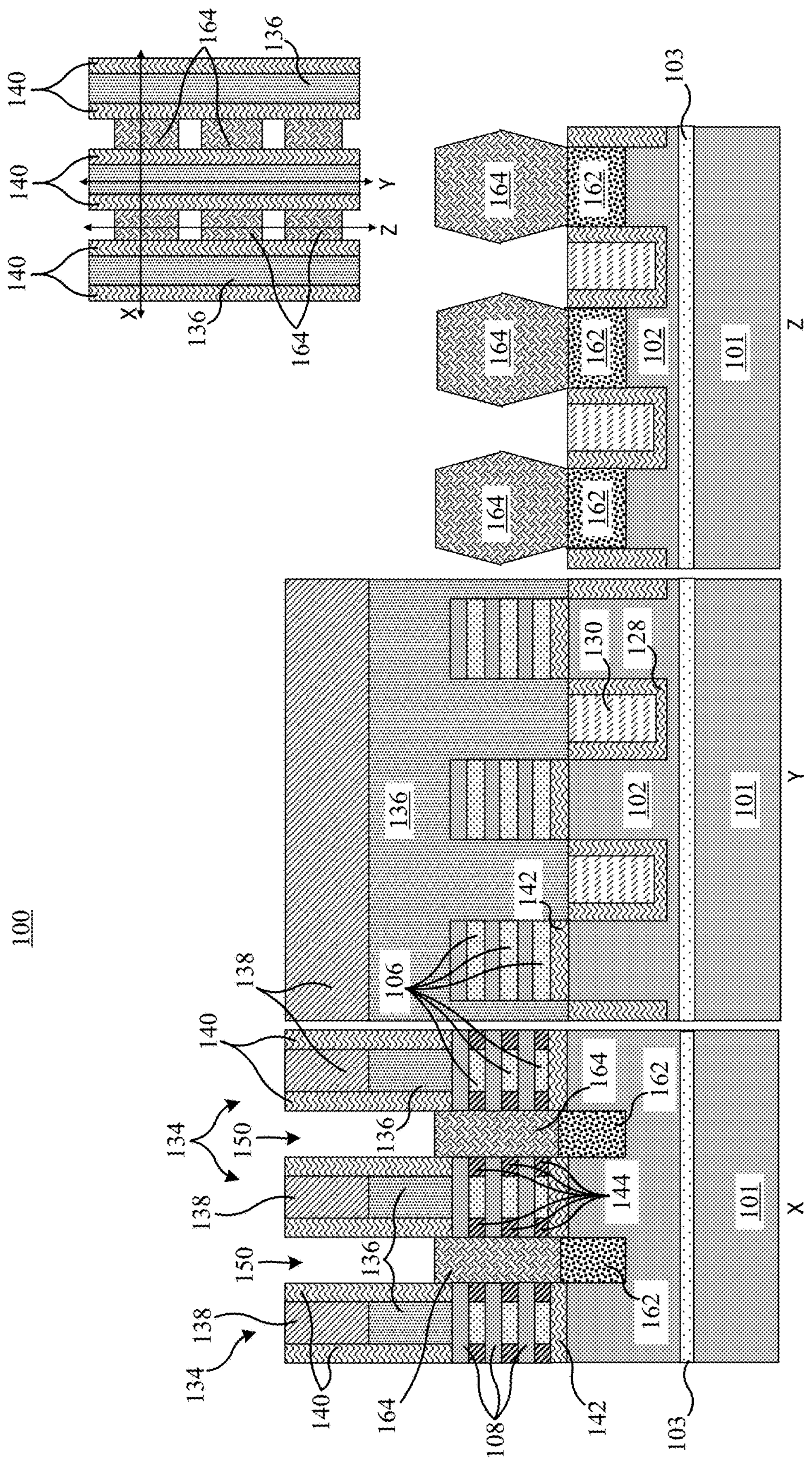

FIG. 4 depicts cross-sectional views of semiconductor IC device 100 shown after illustrative fabrication operation(s), in accordance with one or more embodiments. In the depicted fabrication stage, one or more sacrificial gate structures 134 are formed upon the STI region(s) and upon and around the nanolayer stacks 120. Further, in the depicted fabrication stage, sacrificial nanolayer 104 may be selectively removed. Further, in the depicted fabrication stage, one or more bottom dielectric isolation (BDI) regions 142 and one or more gate spacer(s) 140 may be formed. Further, in the depicted fabrication stage, source/drain (S/D) recesses 150 may be formed within the nanolayer stack 120 between spacers 140 associated with neighboring sacrificial gate structures 134. Further in the depicted fabrication stage, sacrificial nanolayers 106 within nanolayer stacks 120 may be be indented, thereby forming an indent void, and an inner spacer 144 may be formed within a respective indent void. In the depicted fabrication stage, one or more backside contact placeholder(s) 162 may be formed within upper substrate 102. Further, in the depicted fabrication stage, a S/D region 164 is formed upon a respective backside contact placeholder 162.

The sacrificial gate structure(s) 134 may be formed by depositing a sacrificial gate liner layer (e.g., a dielectric, oxide, or the like) upon the STI regions and upon and around nanolayer stacks 120. The sacrificial gate structure 134 may further be formed by subsequently depositing a sacrificial gate layer (e.g., amorphous silicon, or the like) upon the sacrificial gate liner layer. The thickness of the sacrificial gate layer may be greater than the height of the one or more nanolayer stacks 120. The sacrificial gate structure 134 may further be formed by subsequently forming a gate cap layer upon the sacrificial gate layer. The gate cap layer may be formed by depositing a mask material, such as a hard mask material, such as silicon nitride, silicon oxide, combinations thereof, or the like. The gate cap layer may be composed of one or more layers of masking materials to protect the sacrificial gate layer and/or other underlying materials during subsequent processing of semiconductor IC device 100.

The sacrificial gate structure 134 may further be formed by patterning the gate cap layer, sacrificial gate layer, and sacrificial gate liner by, for example, using lithography and etch processes to remove undesired portions and retain desired portion(s), respectively. The retained desired portion(s) of the gate cap layer, sacrificial gate layer, and sacrificial gate liner may form the sacrificial gate liner (not shown), the sacrificial gate 136, and the sacrificial gate cap 138, respectively, of each of the one or more sacrificial gate structures 134.

One or more sacrificial gate structure 134 can be formed on targeted regions or areas of semiconductor IC device 100 to define the length of one or more GAA FETs, one or more GAA FET channels, or the like, and to provide sacrificial material for yielding targeted GAA FET structure(s) in subsequent processing. According to an example, each sacrificial gate structure 134 can have a height of between approximately 50 nm and approximately 200 nm, and a length of between approximately 10 nm and approximately 200 nm.

Further, in the depicted fabrication stage, sacrificial nanolayer 104 may be selectively removed. The sacrificial nanolayer 104 may be removed by a selective removal process, such as a selective etch that removes the sacrificial nanolayer 104 within the nanolayer stacks 120 selective to the materials of the sacrificial nanolayers 106, the active nanolayers 108, the sacrificial gate structures 134, and/or the STI region(s).

Further, in the depicted fabrication stage, gate spacers 140 may be formed upon the sidewall(s) of the sacrificial gate structures 134 and one or more bottom dielectric isolation (BDI) region(s) 142 may be formed in place of the removed sacrificial nanolayer 104. The BDI regions 142 and gate spacer(s) 140 may be respectively formed upon upper substrate 102, may be formed upon the STI region(s), may be formed upon and around nanolayer stacks 120, and may be formed upon and around the one or more sacrificial gate structure(s) 134.

The BDI region(s) 142 may be formed upon the upper substrate 102 between the nanolayers of the nanolayer stack(s) 120 and upper substrate 102. The gate spacer(s) 140 may be formed around each of the one or more sacrificial gate structures 134, may be formed upon at least a portion of the sidewalls of the one or more nanolayer stack 120, and may be formed upon the top surface of portion(s) of the STI regions.

In one example, as depicted, gate spacers 140 and BDI region(s) 142 may be formed of relatively different dielectric materials, such as such as silicon nitride, SiBCN, SiNC, SiN, SiCO, SiNOC, or a combination thereof. In another example, the gate spacer(s) 140 and BDI region(s) 142 may be simultaneously formed by a deposition of a blanket dielectric material, such as silicon nitride, SiBCN, SiNC, SiN, SiCO, SiNOC, or a combination thereof, or the like. Excess, undesired, and/or exposed dielectric material may be subsequently removed by a substrative removal technique, such as an etch.

Further, in the depicted fabrication stage, source/drain (S/D) recesses 150 may be formed within the nanolayer stack(s) 120 between gate spacers 140 that are associated with neighboring sacrificial gate structures 134. Further, in the depicted fabrication stage, sacrificial nanolayers 106 within nanolayer stacks 120 may be indented, thereby forming an indent void, and an inner spacer 144 may be formed within a respective indent void.

The one or more S/D recesses 150 may be formed between sacrificial gate structures 134 by removing sacrificial nanolayer(s) 106, by removing active nanolayer(s) 108, and by removing BDI regions 142 that are between gate spacer(s) 140 of adjacent or neighboring sacrificial gate structures 134. The one or more S/D recesses 150 may be formed to a depth to stop at the upper substrate 102. The one or more S/D recesses 150 may be formed by removing undesired portions of the nanolayers and BDI regions 142 that are not protected by sacrificial gate structure 134 and/or by gate spacer(s) 140, or the like. These undesired portions of the nanolayers and BDI regions 142 may be removed by etching or other subtractive removal techniques. The top surface of STI region(s) (e.g., STI dielectric material 130, etc.) may be used as an etch stop. The retained one or more portions of one or more nanolayer stacks 120 may be such portions thereof that were protected generally below a sacrificial gate structure 134 and/or by the associated gate spacer(s) 140.

The semiconductor IC device 100 may be subsequently subjected to a directional reactive ion etch (RIE) process, which can remove or indent portions of the sacrificial nanolayers 106 that are not covered by the sacrificial gate 136 and/or that are under the spacer(s) 140. The RIE can use a boron-based chemistry or a chlorine-based chemistry, for example, which selectively recesses the exposed portions sacrificial nanolayers 106 (e.g., those portions of sacrificial nanolayers 106 generally below spacer(s) 140, etc.).

Subsequently, a respective inner spacer 144 may be deposited in the recess or indent that was previously formed into the sacrificial nanolayers 106. In certain embodiments, after the formation of the inner spacers 144, an isotropic etch process is performed to create outer vertical edges to the inner spacers 144 that align with outer vertical edges of the active semiconductor nanolayers 108. In certain embodiments, the material of the inner spacer 144 is a dielectric material such as SiN, SiO, SiBCN, SiOCN, siCO, etc.

Further, in the depicted fabrication stage, one or more backside contact placeholder(s) 162 may be formed within upper substrate 102. The one or more backside contact placeholder(s) 162 may be formed by initially forming one or more backside contact placeholder(s) cavities within the upper substrate 102 generally between adjacent sacrificial gate structures 134 and underneath respective S/D locations. For example, the one or more backside contact placeholder(s) cavities may be formed by a subtractive removal technique, such as an etch, that removes associated portion(s) of upper substrate 102. The etch may be timed or otherwise controlled to stop the removal of the upper substrate 102 such that the depth or bottom of the one or more backside contact placeholder(s) 162 is above the etch stop layer 103.

The one or more backside contact placeholder(s) 162 may be further formed by epitaxially growing epitaxial material from exposed substrate 102 surface(s) within the one or more backside contact placeholder(s) cavities. In some embodiments, epitaxial growth and/or deposition processes may be selective to forming on the semiconductor surfaces of substrate 102, and may not deposit material on dielectric surfaces, such as silicon dioxide or silicon nitride surfaces. In some embodiments, the one or more backside contact placeholder(s) 162 epitaxial growth may overgrow above the top surface of substrate 102. In an example, the sacrificial epitaxial material of the one or more backside contact placeholder(s) 162 may be chosen to be etch selective to the material of the S/D region(s) 164, the material of upper substrate 102, or the like. In an example, as depicted in the X view, the one or more backside contact placeholder(s) 162 may be bounded on each side by the substrate and, as depicted in the Z view, may be bounded on the front and rear by respective one or more STI regions.

Further, in the depicted fabrication stage, a S/D region 164 may be formed upon a respective backside contact placeholder 162. The S/D region 164 forms either a source or a drain, respectively, to each associated or connected nanosheet FET (i.e., those FETs in which the source or drain is connected to the active semiconductor nanolayers 108 channels).

S/D regions 164 may be epitaxially grown or formed. The S/D regions 164 may be formed by epitaxially growing epitaxial material upon a respective backside contact placeholder 162 within the logic region between neighboring nanosheet FETs. In some examples, S/D regions 164 are formed by in-situ doped epitaxial growth. In some embodiments, the S/D regions 164 epitaxial growth may overgrow above the upper surface of the topmost active semiconductor nanolayer 108 within the one or more nanolayer stack(s) 120.

Suitable n-type dopants include but are not limited to phosphorous (P), and suitable p-type dopants include but are not limited to boron (B). The use of an in-situ doping process is merely an example. For instance, one may instead employ an ex-situ process to introduce dopants into the source and drains. Other doping techniques can be used to incorporate dopants in the bottom source/drain region. Dopant techniques include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques. In preferred embodiments, the S/D epitaxial growth conditions that promote in-situ Boron doped SiGe for p-type transistors and phosphorus or arsenic doped silicon or Si:C for n-type transistors. The doping concentration in the S/D regions 164 can be in the range of about $1\times10^{19}$ cm-3 to about $2\times10^{21}$ cm-3, or preferably between $2\times10^{20}$ cm-3 to $7\times10^{20}$ cm-3.

In certain implementations, the S/D regions 164 may be partially recessed such that an upper portion of the S/D regions 164 are removed. For example, the upper portion of the S/D regions 164 may be etched or otherwise removed. The etch may be timed or otherwise controlled to stop the removal of S/D regions 164 such that the top surface(s) thereof are above the upper surface of the topmost active nanolayer 108.

Figure 5:
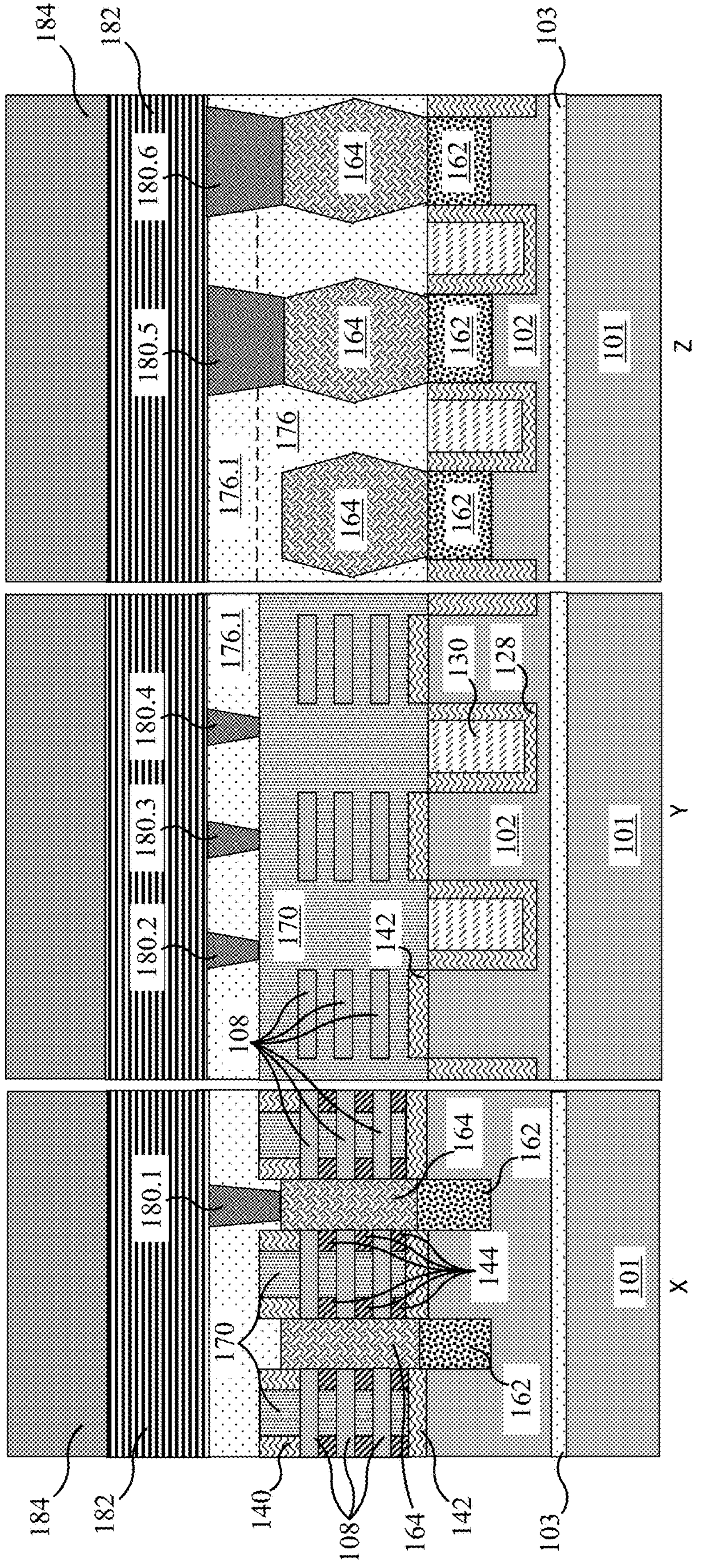

FIG. 5 depicts cross-sectional views of semiconductor IC device 100 shown after illustrative fabrication operation(s), in accordance with one or more embodiments. In the depicted fabrication stage, interlayer dielectric (ILD) 176 may be formed upon S/D regions 164 and/or upon STI regions. Further, in the depicted fabrication stage, sacrificial gate structures 134 may be removed, the sacrificial nanolayers 106 may be removed, and a replacement gate structure 170 may be formed. Further, in the depicted fabrication stage, an ILD 176.1 is formed and one or more frontside contact(s) 180 (e.g., 180.1 through 180.6, or the like) are formed. Further, in the depicted fabrication stage, a frontside back end of the line (BEOL) network 182 may be formed and a carrier wafer 184 may be bonded to the BEOL network 182.

The ILD 176 may be formed upon and around the S/D regions 164, upon STI region(s), upon spacer(s) 140, or the like. The ILD 176 may be formed by depositing a dielectric material upon S/D region 164, upon STI region(s), or the like. The ILD 176 can be any suitable material, such as, for example, porous silicates, carbon doped oxides, silicon dioxides, silicon nitrides, silicon oxynitrides, or other dielectric materials. In an example, the ILD 176 may be formed to a thickness so that the top surface of the ILD 176 is above the semiconductor IC device 100 and subsequently etched back such that the top surface of the ILD 176 is coplanar with a top surface of the gate hard mask 118 and/or a top surface of gate spacer(s) 140. In another example, a planarization process, such as a chemical mechanical polish (CMP), may be performed to create a planar upper surface for the semiconductor IC device 100. In this example, the CMP may be performed to a depth to expose the sacrificial gate structure 134 (e.g., the sacrificial gate cap 138 may be removed).

Further, in the depicted fabrication stage, the sacrificial gate structure(s) 134 may be removed and a respective replacement gate structure 170 is formed in place thereof. The sacrificial gate structures 134 may be removed by removing associated portions of sacrificial gate cap 138 (if not already removed), sacrificial gate 136, sacrificial gate oxide (if present), and the sacrificial nanolayers 106 thereunder by a subtractive removal technique, such as one or more of etches. For example, removal of these features may be accomplished by an etching process which may include a dry etching process such as RIE, plasma etching, ion etching or laser ablation. The etching can further include a wet chemical etching process(es).

After the removal of sacrificial nanolayers 106 that were under the sacrificial gate structure(s) 134, void spaces between the active semiconductor nanolayers 108 and/or BDI region 142 may be formed. The removal of the sacrificial gate 136, the sacrificial oxide layer, the sacrificial nanolayers 106, and/or the like, may be selective to the respective materials of active semiconductor nanolayers 108, upper substrate 102, inner spacers 144, BDI region 142, gate spacers 140, or the like. The dry and wet etching processes can have etching parameters that can be tuned, such as etchants used, etching temperature, etching solution concentration, etching pressure, source power, RF bias voltage, RF bias power, etchant flow rate, and other suitable parameters. Dry etching processes can include a biased plasma etching process that uses a chlorine-based chemistry. Other dry etchant gasses can include Tetrafluoromethane (CF4), nitrogen trifluoride (NF3), sulfur hexafluoride (SF6), and helium (He), and Chlorine trifluoride (ClF3). Dry etching can also be performed anisotropically using such mechanisms as DRIE (deep reactive-ion etching). Chemical vapor etching can be used as a selective etching method, and the etching gas can include hydrogen chloride (HCl), Tetrafluoromethane (CF4), and gas mixture with hydrogen (H2). Chemical vapor etching can be performed by CVD with suitable pressure and temperature.

The replacement gate structure 170 may be formed by initially forming an interfacial layer (not shown) on the interior surfaces of the gate spacer(s) 140, on the interior surfaces of the active semiconductor nanolayers 108, on the inner surface(s) of gate spacers 140, on the BDI region 142, on the STI region(s), or the like. A high-κ layer (not shown) may be formed to cover the surfaces of exposed surfaces of the interfacial layer. The high-κ layer can be deposited by any suitable techniques, such as ALD, CVD, metal-organic CVD (MOCVD), physical vapor deposition (PVD), thermal oxidation, combinations thereof, or other suitable techniques. A high-κ material is a material with a higher dielectric constant than that of $SiO_2$, and can include e.g., LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, BaSrTiO3 (BST), Al2O3, Si3N4, oxynitrides (SiON), or other suitable materials. The high-κ layer can include a single layer or multiple layers, such as metal layer, liner layer, wetting layer, and adhesion layer. In other embodiments, the high-κ layer can include, e.g., Ti, Ag, Al, TiAlN, TaC, TaCN, TaSiN, Mn, Zr, TiN, TaN, Ru, Mo, Al, WN, Cu, W, or any suitable materials.

Replacement gate structure 170 may be further formed by depositing a work function (WF) gate (not shown) upon the high-κ layer. The WF gate can be comprised of metals, such as, e.g., copper (Cu), cobalt (Co), aluminum (Al), platinum (Pt), gold (Au), titanium (Ti), nitride (N) or any combination thereof. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering. In general, the work function (WF) gate sets the threshold voltage (Vt) of the transistors associated with the active semiconductor nanolayers 108. The high-κ layer can separate the WF gate and the active semiconductor nanolayers 108. The WF gate may be formed to a thickness to generally fill the gaps or voids between active semiconductor nanolayers 108.

Replacement gate structure 170 may be further formed by depositing a conductive fill gate 172 upon the WF gate. The conductive fill gate 172 can be comprised of metals, such as but not limited to, e.g., tungsten, aluminum, ruthenium, rhodium, cobalt, copper, tantalum, titanium, carbon nanowire materials including graphene, or the like. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering. After the replacement gate structure 170 formation, the top surface of the semiconductor IC device 100 may be planarized by a planarization technique such as a CMP.

Further, in the depicted fabrication stage, a ILD 176.1 may be formed upon the top surface of ILD 176, upon the top surface of gate spacer(s) 140, upon the top surface of replacement gate structure(s) 170, and/or the like. The ILD 176.1 may be formed by depositing a dielectric material, such as, for example, porous silicates, carbon doped oxides, silicon dioxides, silicon nitrides, silicon oxynitrides, or other dielectric materials. Any known manner of forming the ILD 176.1 can be utilized. The ILD 176.1 can be formed using, for example, CVD, PECVD, ALD, flowable CVD, spin-on dielectrics, or PVD. The ILD 176.1 may be the same or different material relative to ILD 176.

As noted, one or more frontside contacts 180 may be formed in the depicted fabrication stage. The frontside contact(s) may be formed by initially forming frontside contact openings (not shown) within ILD 176.1, within both ILD 176.1 and ILD 176, or the like. The formation of front-side contact openings may include etching the ILDs to form the opening. A respective opening may expose at least a portion of S/D region 164, at least a portion of the replacement gate structure 170, or the like. Frontside contacts 180 may be formed by depositing conductive material within the front-side contact openings. The formation of the frontside contacts 180 may include forming a blanket conductive barrier layer extending into the front-side contact openings, depositing a metal or conductive material over the blanket conductive barrier layer, and performing a planarization process, such as a CMP process or a mechanical grinding process, to remove excess portions of the conductive barrier layer and the conductive material. Frontside contacts 180 may consist of a liner formed of Ni, NiPt, Ti, TiN, TaN, etc. and a conductive fill thereupon, such as Al, Ru, W, Co, Cu, etc. In some implementations, the formation of frontside contacts 180 may be a part of middle of the line (MOL) fabrication processes.

Respective frontside contacts 180.1, 180.5, and/or 180.6 may contact or otherwise meld to the exposed portion of respective S/D regions 164. These respective frontside contact 180.1, 180.5, and/or 180.6 may provide power potential (VDD, VSS, or the like) thereto. Other respective frontside contacts 180.2, 180.3, and 180.4 may contact otherwise meld to one or more replacement gate structure(s) 170. These respective frontside contacts 180.2, 180.3, and 180.4 may be further connected to a signal line and electrically carry a functional or logical potential or signal that is to change or is otherwise dynamic over time. Such functional or logical potential of the frontside contacts 180.2, 180.3, and 180.4 may determine whether the associated transistor(s) is on or off.

Frontside BEOL network 182 may include metallization levels, associated metallization dielectric or passivation layers, vertical vias that connect the metallization feature(s) within the metallization levels with an underlying device or structure, and/or conductive I/O pads, or the like. Frontside BEOL network 182 may include respective same or different signal line(s) or wiring line(s), such as a conductive wire(s), conductive trace(s), or the like, that are formed over frontside contacts 180, making electrical contact therewith. A signal line is defined herein as a conductive wiring feature that is configured to electrically carry a functional or logical potential or signal that is to change or is otherwise dynamic over time.

In some examples, there may be five metal levels $M_0$-$M_4$ within frontside BEOL network 182. In some examples, there may be more than ten metal levels $M_0$-$M_9$ within BEOL network 182. In some examples, a frontside contact 180 may connect a respective S/D region 164 to a via, signal line, power rail, or the like, that is located within a lowest BEOL metal level $M_0$. Generally, the frontside BEOL network 182 are located on the frontside of the semiconductor IC device 100.

Upon completion of the frontside BEOL network 182, a carrier wafer 184 may be bonded or otherwise attached to the top surface of BEOL network 182. Carrier wafer 184 may be attached to semiconductor device 100 by a carrier bonding technique.

Figure 6:
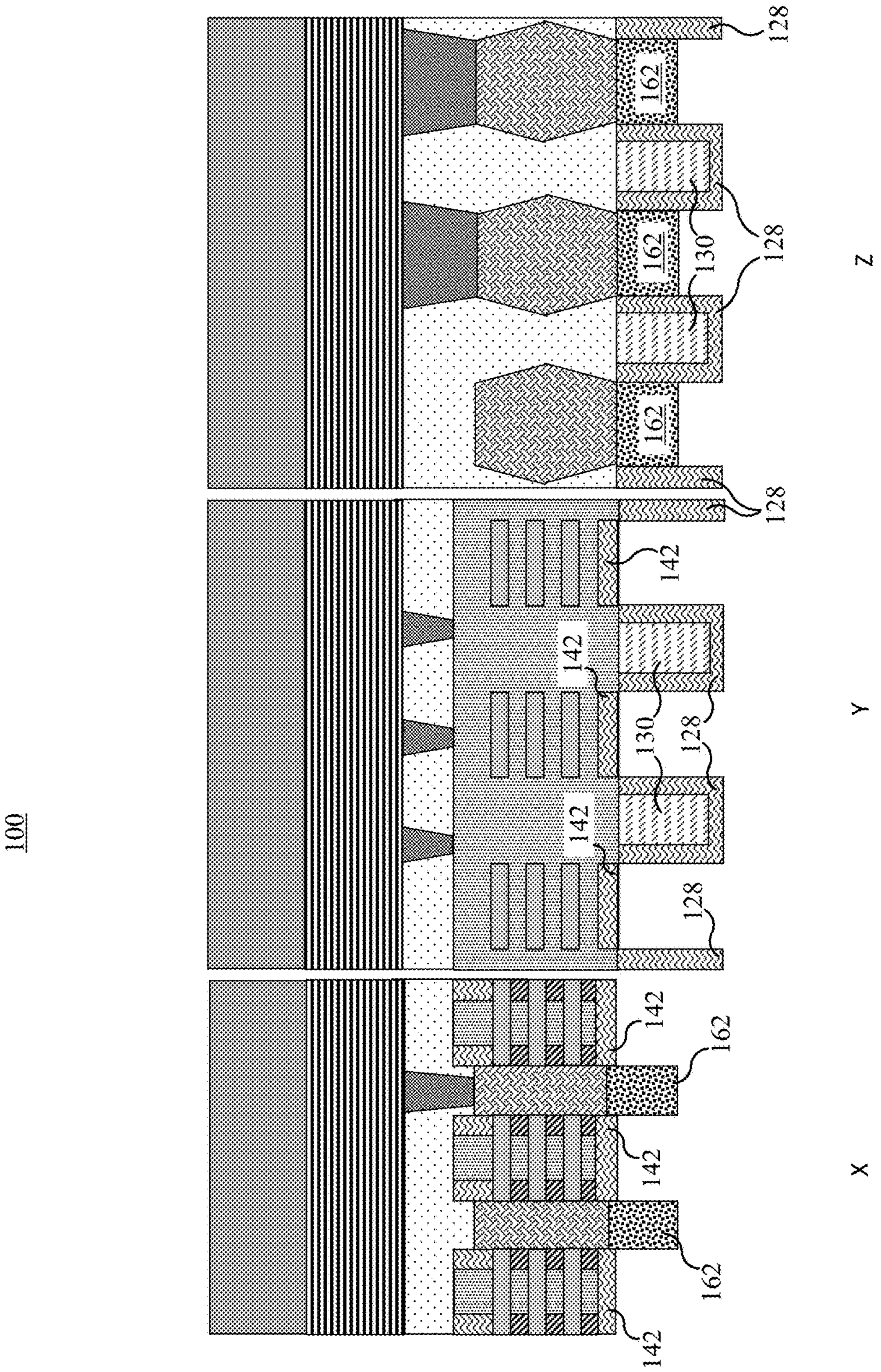

FIG. 6 depicts cross-sectional views of semiconductor IC device 100 shown after illustrative fabrication operation(s), in accordance with one or more embodiments. In the depicted fabrication stage, semiconductor IC device 100 may be flipped (not shown) and lower substrate 101 may be removed. Further, in the depicted fabrication stage, etch stop layer 103 and the upper substrate 102 may be removed.

The lower substrate 101 may be removed by any removal technique, such as a combination of wafer grinding, CMP, dry and wet etch. In the example depicted, lower substrate 101 is removed by an etch that utilizes etch stop layer 103 as the etch stop. In this example, removal of lower substrate 101 exposes the bottom surface (consistent with the orientation depicted in the drawings) of etch stop layer 103.

The etch stop layer 103 may be removed by a subtractive removal technique such as a CMP, dry and/or wet etch. Upon removal of the etch stop layer 103, the bottom surface (consistent with the orientation depicted in the drawings) of the upper substrate 102.

The upper substrate 102 may be removed by an appropriate substrative removal technique, such as an etch, that removes the upper substrate 102. The etch may be timed or otherwise controlled to remove the material of substrate 102 selective to the backside contact placeholder(s) 162, BDI(s) 142, STI liner 128, or the like.

In other words, the lower substrate 101, etch stop layer 103 (if present), and the upper substrate 102 may be removed by one or more removal techniques, such as a combination of wafer grinding, CMP, dry and/or wet etch.

Figure 7:
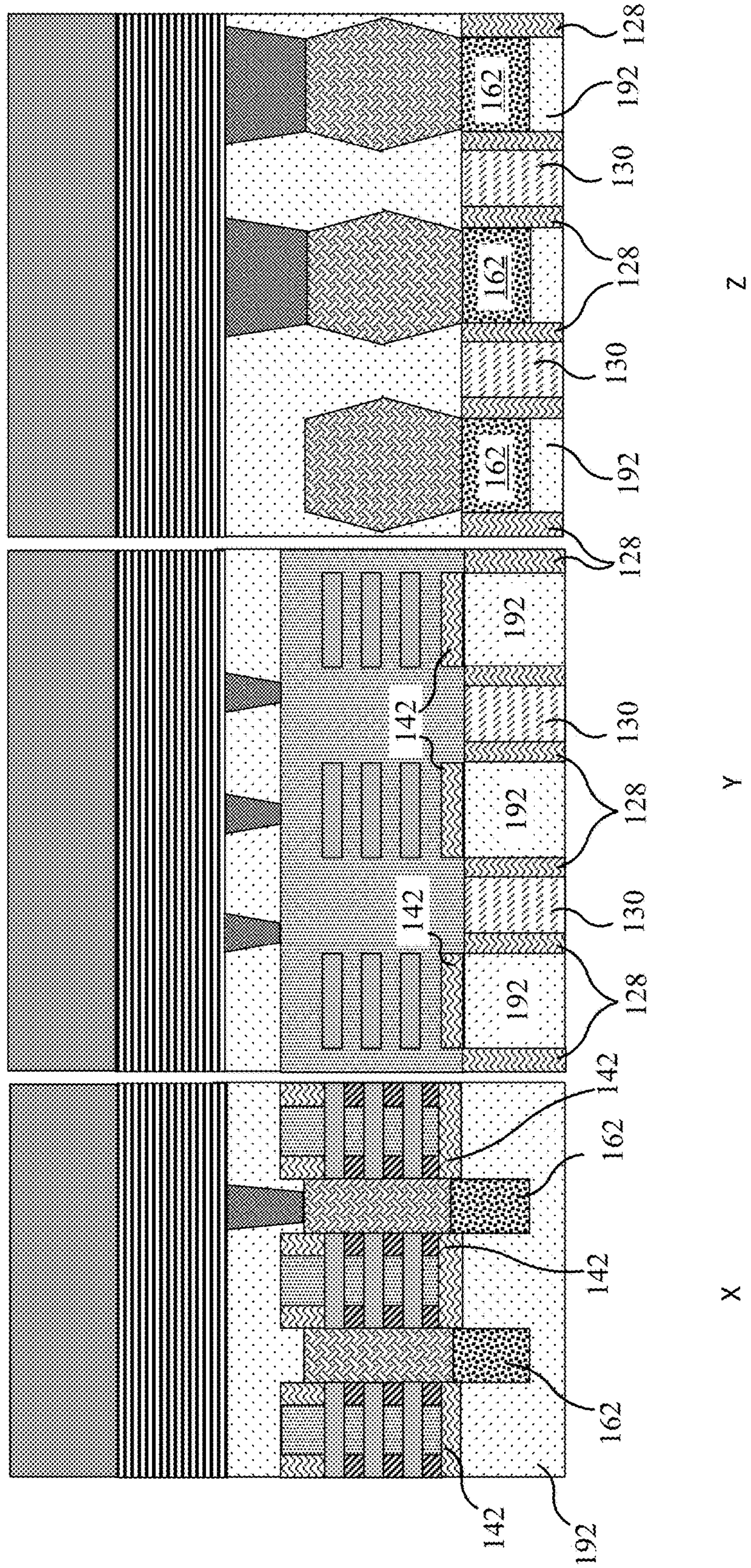

FIG. 7 depicts cross-sectional views of semiconductor IC device 100 shown after illustrative fabrication operation(s), in accordance with one or more embodiments. In the depicted fabrication stage, ILD 192 is formed. The ILD 192 may be formed upon the bottom surfaces (consistent with the orientation depicted in the drawings) of BDI region(s) 142, upon and around the backside contact placeholder(s) 162, and upon STI region(s). The ILD 192 may be formed by depositing a dielectric material, such as, for example, porous silicates, carbon doped oxides, silicon dioxides, silicon nitrides, silicon oxynitrides, or other dielectric materials. Any appropriate deposition technique for forming the ILD 192 can be utilized. The ILD 192 can be formed using, for example, CVD, PECVD, ALD, flowable CVD, spin-on dielectrics, or PVD. For clarity, the material of ILD 192 may be chosen to have etch selectivity with the material(s) of the STI liner 128 and STI dielectric material 130.

Figure 8:
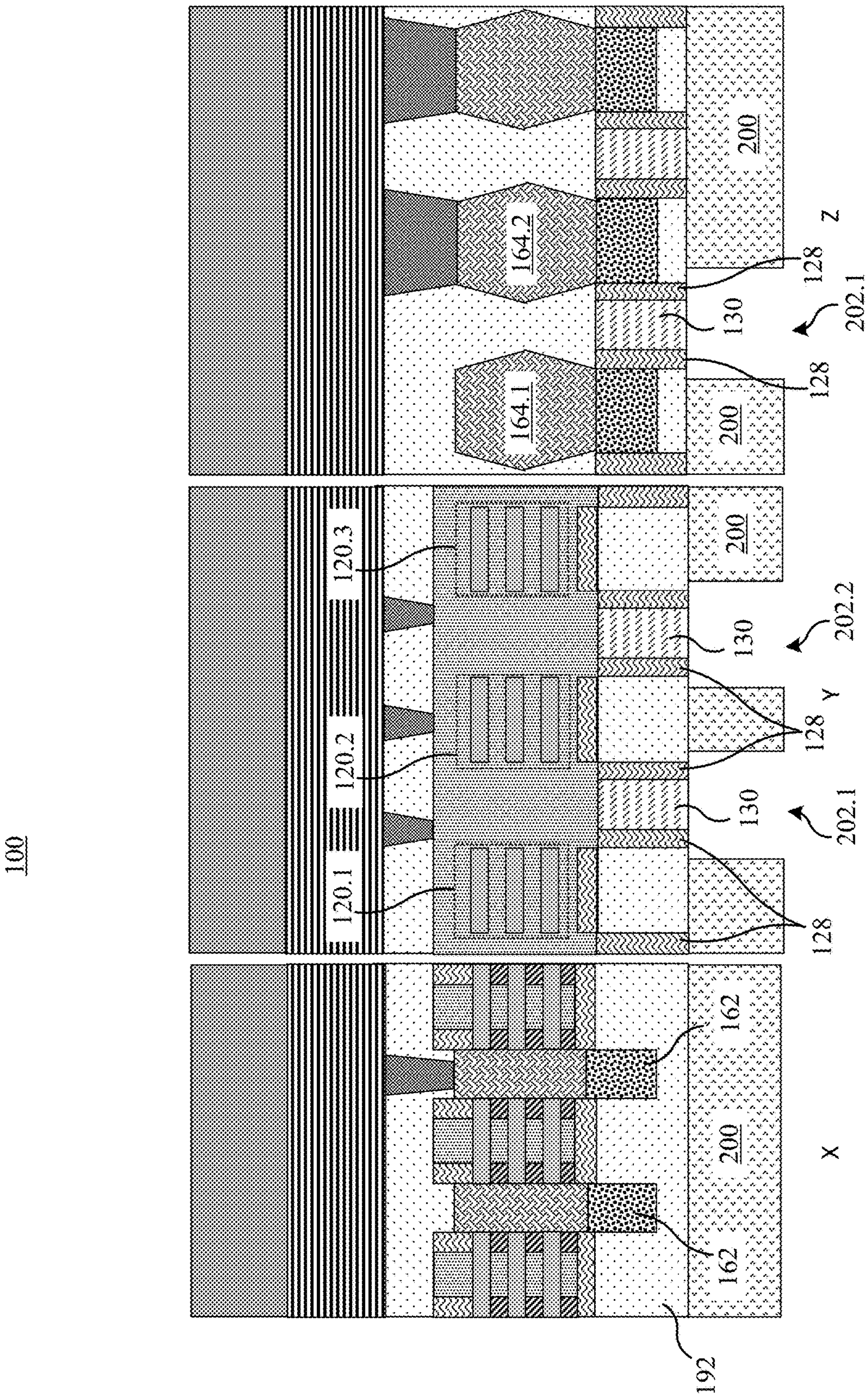

FIG. 8 depicts cross-sectional views of semiconductor IC device 100 shown after illustrative fabrication operation(s), in accordance with one or more embodiments. In the depicted fabrication stage, a gate cut mask 200 is formed and patterned to create a gate cut opening 202.2 over a single replacement gate structure 170 and/or a gate cut trench 202.1 over multiple replacement gate structures 170.

The gate cut mask 200 which may consist of a nitride material, such as, but not necessarily limited to, silicon nitride (SiN) or titanium nitride (TiN), a low temperature oxide, such as an organic planarization layer (OPL), may be formed on the bottom surfaces (consistent with the orientation depicted in the drawings) of ILD 192 and STI regions. The gate cut mask 200 can be deposited using deposition techniques including, but not necessarily limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering. In some embodiments, a planarization process, such as, chemical mechanical planarization (CMP) can be used to remove excess gate cut mask 200 material. A thickness of the gate cut mask 200 can be in the range of, but is not necessarily limited to, 20 nm to 100 nm.

Subsequently, a photoresist (not shown) may be formed on the bottom surface (consistent with the orientation depicted in the drawings) of the gate cut mask 200. The photoresist may include a positive-tone photoresist composition, a negative-tone photoresist composition, or a hybrid-tone photoresist composition. A layer of photoresist material may be formed by a deposition process such as, for example, spin-on coating.

The deposited photoresist may be subjected to a pattern of irradiation, and the exposed photoresist material may be developed utilizing resist developer. The pattern provided by the patterned photoresist material may be then transferred through the gate cut mask 200 to form one or more gate cut opening(s) 202.2 and/or one or more gate cut trench(es) 202.1.

The pattern transfer etching process to form the gate cut opening(s) 202.2 and/or the gate cut trench(es) 202.1 may be an anisotropic etch. In certain embodiments, a dry etching process such as, for example, reactive ion etching (RIE) can be used. In other embodiments, a wet chemical etchant can be used. In still further embodiments, a combination of dry etching and wet etching can be used.

The etch of gate cut mask 200 defines the areal dimensions of the gate cut opening(s) 202.2 and/or the gate cut trench(es) 202.1 within the gate cut mask 200. The gate cut opening 202.2 and/or the gate cut trench 202.1 within the gate cut mask 200 may have areal dimensions (length and width) that independently range from 10 to 40 nm, e.g., 10, 15, 20, 25, 30, 35, 40 nm, or more, including ranges between any of the foregoing values, although lesser and greater dimensions may be used. As shown in the Y cross-section view, a lateral width (w) of the gate cut trench 202.1 may be defined with substantially vertical sidewalls of the gate cut trench 202.1. In certain embodiments, the width (w) of the gate cut trench 202.1 is substantially the same as a width of an associated STI region that separates neighboring active regions. For example, the width (w) of the gate cut trench 202.1 may be less than 20 nm, e.g., 5, 10, or 15 nm. A lateral length (l) of the gate cut trench 202.1 may be defined with substantially vertical sidewalls (e.g., vertically parallel sidewalls that extend into and out of the page in the Y view, respectively). In certain embodiments, the length (l) of the gate cut trench 202.1 is at least the dimension or pitch of two or more neighboring replacement gate structures 170 (e.g., the gate cut trench 202.1 spans multiple replacement gate structures 170 and their associated gate spacers 140).

As shown in the Y cross-section view, a lateral width (w) of the gate cut opening 202.2 may be substantially like the width (w) of the gate cut trench 202.1. A lateral length (l) of the gate cut opening 202.2 may be defined with substantially vertical sidewalls of the gate cut opening 202.2 (e.g., vertically parallel sidewalls that extend into and out of the page in the Y view, respectively). In certain embodiments, the length (l) of the gate cut opening 202.2 is at least the dimension between outward facing surfaces of the gate spacer(s) 140 associated with the same replacement gate structure 170. In another example, the length of gate cut opening 202.2 spans a single replacement gate structure 170 internal to its associated gate spacers 140.

During etching of the gate cut mask 200 to form the gate cut opening(s) 202.2 and/or the gate cut trench(es) 202.1 therein, the materials adjacent to the perimeter footprint of the gate cut opening 202.2 and/or the gate cut trench 202.1 are protected by the overlying gate cut mask 200.

As depicted in the X view and in the Y view, the gate cut trench 202.1 may be located vertically in the middle of nanosheet stack 120.1 and nanosheet stack 120.2 and may have a length (l) sufficient to further extend vertically in the middle of S/D region 164.1 and S/D region 164.2. Similarly, gate cut opening 202.2 may be located vertically in the middle of nanosheet stack 120.2 and nanosheet stack 120.3 but is associated with the single replacement gate structure 170 depicted in the Y view.

In some implementations, the gate cut opening(s) 202.2 and/or the gate cut trench(es) 202.1 within the gate cut mask 200 may expose a respective one or more STI regions there above (consistent with the orientation depicted in the drawings). For example, gate cut opening 202.2 exposes STI dielectric 130.2 and gate cut trench 202.1 exposes STI dielectric 130.1 and STI dielectric 130.3.

Figure 9:
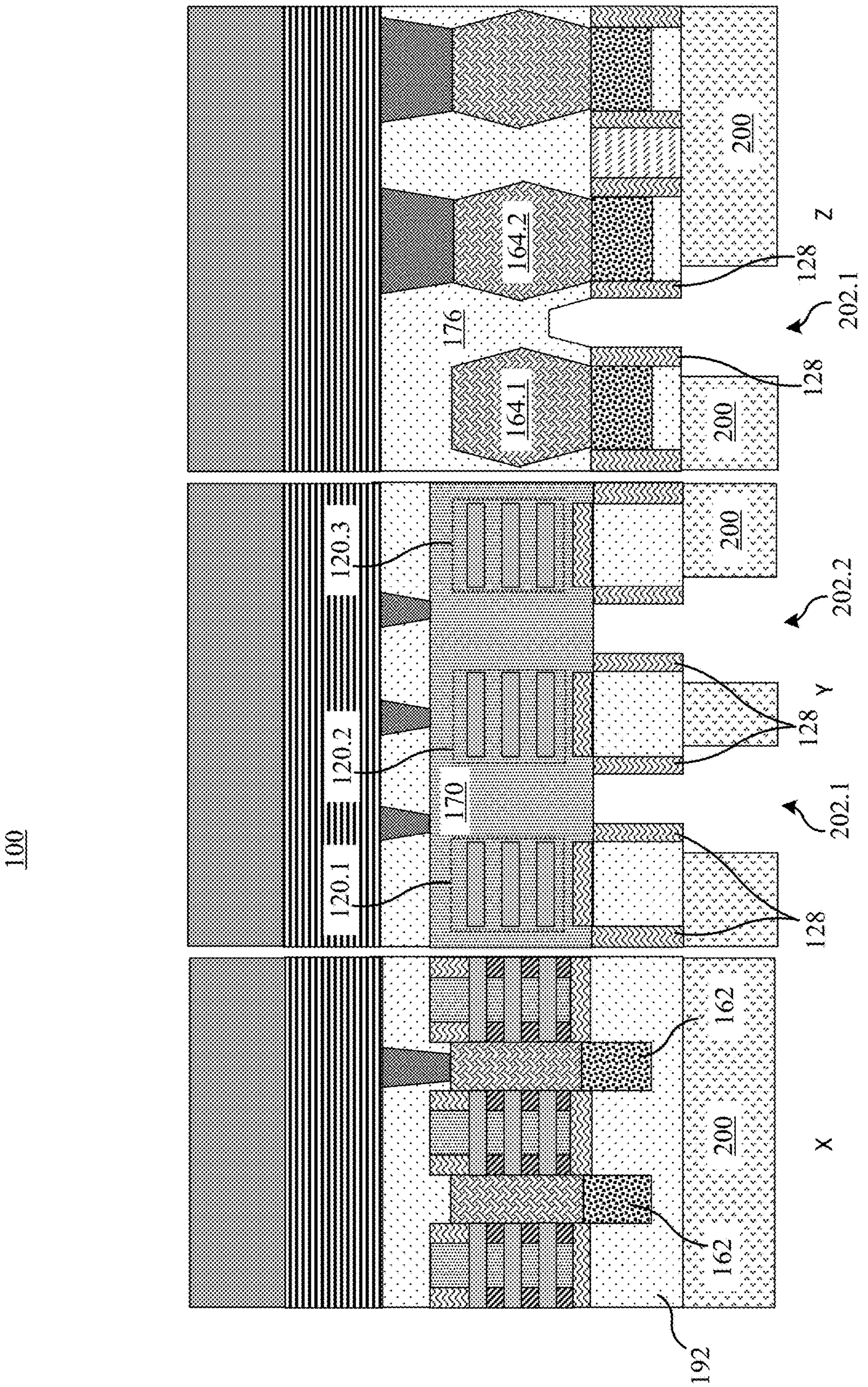

FIG. 9 depicts cross-sectional views of semiconductor IC device 100 shown after illustrative fabrication operation(s), in accordance with one or more embodiments. In the depicted fabrication stage, portions of the one or more STI regions exposed by the gate cut opening(s) 202.2 and/or the gate cut trench(es) 202.1 are removed. For example, the exposed STI dielectric 130.1, STI dielectric 130.2, and STI dielectric 130.3 are removed. In other words, the gate cut opening(s) 202.2 and/or the gate cut trench(es) 202.1 are directionally enlarged toward the associated replacement gate structure(s) 170 by the removal of the one or more associated STI regions. In this way portion(s) of a respective bottom surface of the replacement gate structure(s) 170 may be exposed by the gate cut opening(s) 202.2 and/or the gate cut trench(es) 202.1.

The pattern transfer etching process to directionally enlarge the gate cut opening(s) 202.2 and/or the gate cut trench(es) 202.1 may be an anisotropic etch. In certain embodiments, a dry etching process such as, for example, reactive ion etching (RIE) can be used. In other embodiments, a wet chemical etchant can be used. In still further embodiments, a combination of dry etching and wet etching can be used.

The etch of the one or more associated STI regions exposed by the patterned gate cut mask 200 defines the areal dimensions of the gate cut opening(s) 202.2 and/or the gate cut trench(es) 202.1 that expose the associated replacement gate structure(s) 170. The lateral length (l) of the gate cut trench 202.1 and the lateral length (l) of the gate cut opening 202.2 is maintained by the removal of the one or more associated STI regions.

As depicted in the X view and in the Y view, the enlarged gate cut trench 202.1 may be located vertically in the middle of nanosheet stack 120.1 and nanosheet stack 120.2 and may have a length (l) sufficient to further extend vertically in the middle of S/D region 164.1 and S/D region 164.2. Similarly, the enlarged gate cut opening 202.2 may be located vertically in the middle of nanosheet stack 120.2 and nanosheet stack 120.3 but is associated with the single replacement gate structure 170 depicted in the Y view.

In some implementations, the enlarged gate cut opening(s) 202.2 and/or the gate cut trench(es) 202.1 within the gate cut mask 200 may expose a respective one or more replacement gate structures there above (consistent with the orientation depicted in the drawings). For example, the enlarged gate cut opening 202.2 exposes replacement gate structure 170 and gate cut trench 202.1 exposes multiple replacement gate structures and exposes or partially removes ILD 192 between the multiple replacement gate structures and between S/D region 164.1 and S/D region 164.2.

Figure 10:
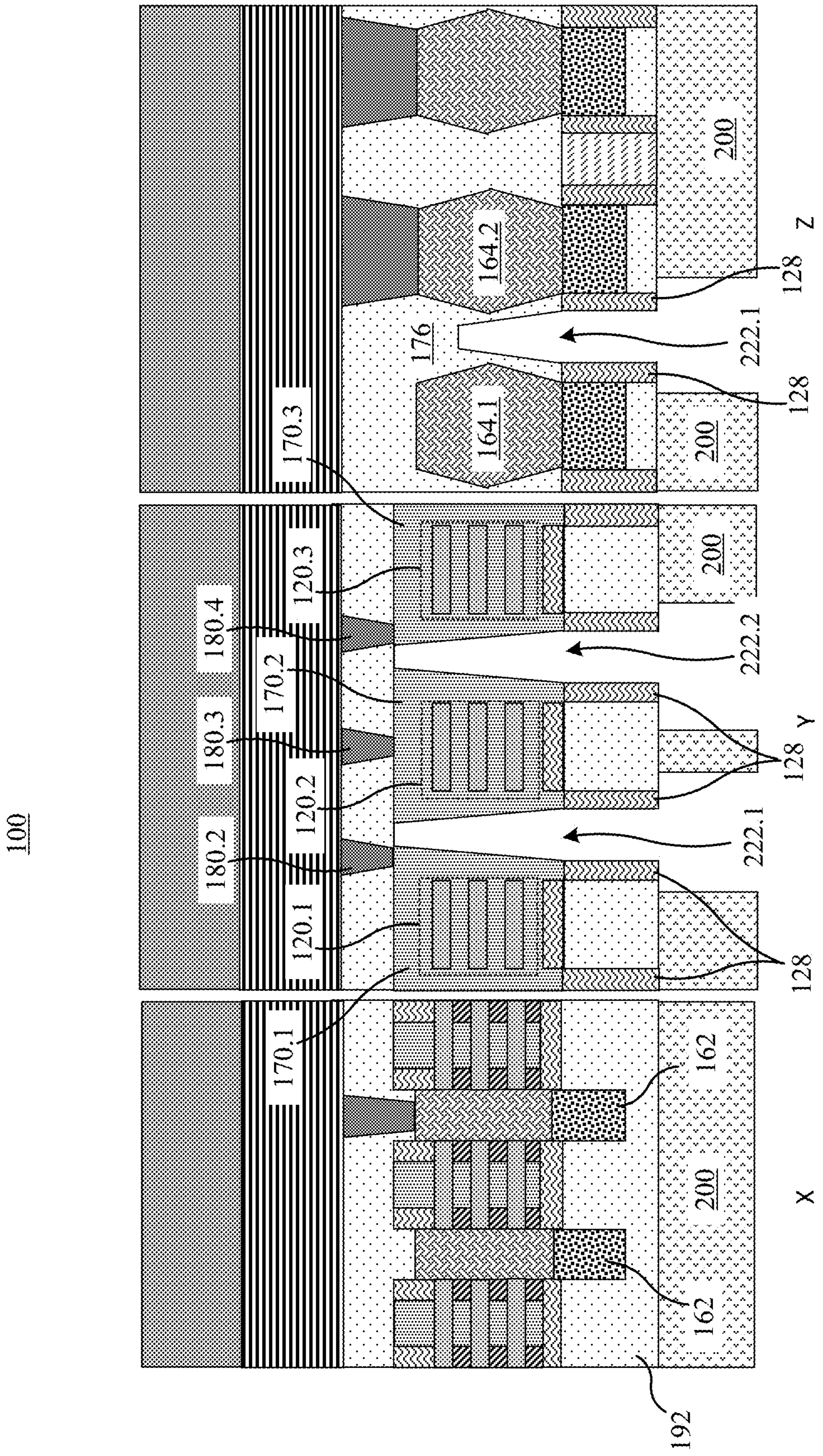

FIG. 10 depicts cross-sectional views of semiconductor IC device 100 shown after illustrative fabrication operation (s), in accordance with one or more embodiments. In the depicted fabrication stage, using the gate cut mask 200 and the enlarged gate cut trench 202.1, and/or the enlarged gate cut opening 202.2, one or more gate cut opening(s) 222.2 and/or one or more gate cut trench(es) 222.1 are etched into the associated replacement gate structure(s) 170.

The etching process to form the one or more gate cut opening(s) 222.2 and/or the one or more gate cut trench(es) 222.1 is an etch that results in a bottom dimension "a" that is greater than a top dimension "b". For example, an anisotropic etch may be used. In certain embodiments, a dry etching process such as, for example, reactive ion etching (RIE) can be used. In other embodiments, a wet chemical etchant can be used. In still further embodiments, a combination of dry etching and wet etching can be used.

In certain embodiments, the gate cut mask 200 and the enlarged gate cut trench 202.1, and/or the enlarged gate cut opening 202.2 are adapted to function as a masking layer that, in conjunction with the etch (e.g., RIE, or the like) of replacement gate structure(s) 170, defines the areal dimensions of the gate cut opening(s) 222.2 and/or the one or more gate cut trench(es) 222.1 within the replacement gate structure(s) 170. The gate cut opening(s) 222.2 and/or the one or more gate cut trench(es) 222.1 within the one or more replacement gate structure(s) 170 may have areal dimensions (length and width) that independently range from 10 to 40 nm, e.g., 10, 15, 20, 25, 30, 35, or 40 nm, including ranges between any of the foregoing values, although lesser and greater dimensions may be used.

For clarity, the gate cut opening(s) 222.2 and/or the one or more gate cut trench(es) 222.1 may have a thickness to fully separate the associated replacement gate structures 170 into segments (e.g., etched entirely through the replacement gate structures 170). For example, the etching of the replacement gate structure 170 may form replacement gate structure 170.1, replacement gate structure 170.2, and replacement gate structure 170.3. As depicted, each of the replacement gate structures 170.1, 170.2, and 170.3 may be associated (e.g., formed therearound, or the like) with one of the nanolayer stacks 120.1, 120.2, and 120.3, respectively.

As depicted, the gate cut trench 222.1 may be located to allow the frontside contact 180.2 to meld with or contact the resulting replacement gate structure 170.1. Similarly, the gate cut opening 222.2 may be located to allow the frontside contact 180.4 to meld with or contact the resulting replacement gate structure 170.3. Likewise, the gate cut trench 222.1 and the gate cut opening 222.2 may be located to allow the frontside contact 180.3 to meld with or contact the resulting replacement gate structure 170.2. In other words, generally, the gate cut trenches or openings may be placed in locations to effectively separate the gate structure(s) so that subsequently a frontside contact may contact or meld with such separate gate structure(s).

As depicted in the X view and in the Y view, the gate cut trench 222.1 may be located vertically in the middle of nanosheet stack 120.1 and nanosheet stack 120.2 and may have a length (l) sufficient to further extend vertically in the middle of S/D region 164.1 and S/D region 164.2. Similarly, gate cut opening 222.2 may be located vertically in the middle of nanosheet stack 120.2 and nanosheet stack 120.3 but is associated with the single replacement gate structure 170 depicted in the Y view.

In some implementations, the gate cut trench 222.1 separates or forms sections within multiple replacement gate structures and also exposes or partially removes ILD 192 between the multiple replacement gate structures and between S/D region 164.1 and S/D region 164.2.

Figure 11:
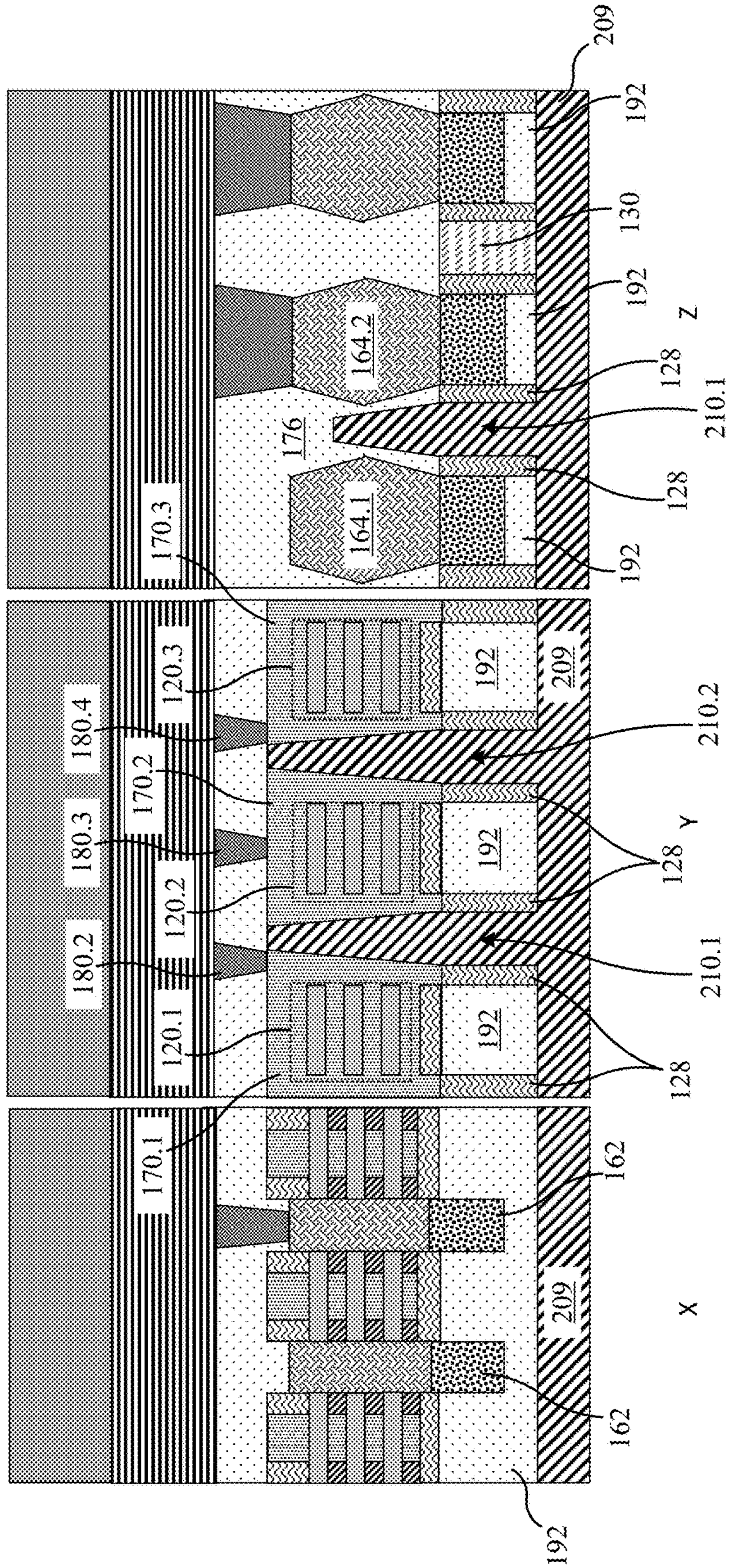

FIG. 11 depicts cross-sectional views of semiconductor IC device 100 shown after illustrative fabrication operation (s), in accordance with one or more embodiments. In the depicted fabrication stage, an isolation layer 209 is formed and thereby forms or otherwise includes a respective gate cut region 210.1 within the one or more gate cut trench(es) 222.1 and forms a respective gate cut region 210.2 within the one or more gate cut opening(s) 222.2.

The isolation layer 209 may be formed by depositing a blanket dielectric or isolation material upon the ILD 192, upon the STI liner(s) 128, within the one or more gate cut trench(es) 222.1, and/or within the one or more gate cut opening(s) 222. The blanket dielectric or isolation material can be any suitable dielectric or isolation material to adequately electrically separate replacement gate structures 170.1, 170.2 and/or 170.3, such as, for example, porous silicates, oxides, nitrides, silicon oxynitrides, low-K materials (i.e., materials with a lower dielectric constant relative to $SiO_2$), or other dielectric or isolation materials. The blanket dielectric or isolation material can be formed by, for example, CVD, PECVD, ALD, flowable CVD, spin-on dielectrics, PVD, or the like. Subsequently, a planarization process, such as a CMP process or a mechanical grinding process, may remove excess portions of the blanket dielectric or isolation material.

For clarity, the gate cut region 210.1 may have a length into and out of the page that spans two or more different replacement gate structures 170. Consequently, as depicted in the Z view, the gate cut region 210.1 may be located between S/D region 164.1 and S/D region 164.2. Similarly, the gate cut region 210.2 may have a length into and out of the page that spans one replacement gate structure 170 or that spans one replacement gate structure 170 along with its associated gate spacers 140.

Figure 12:
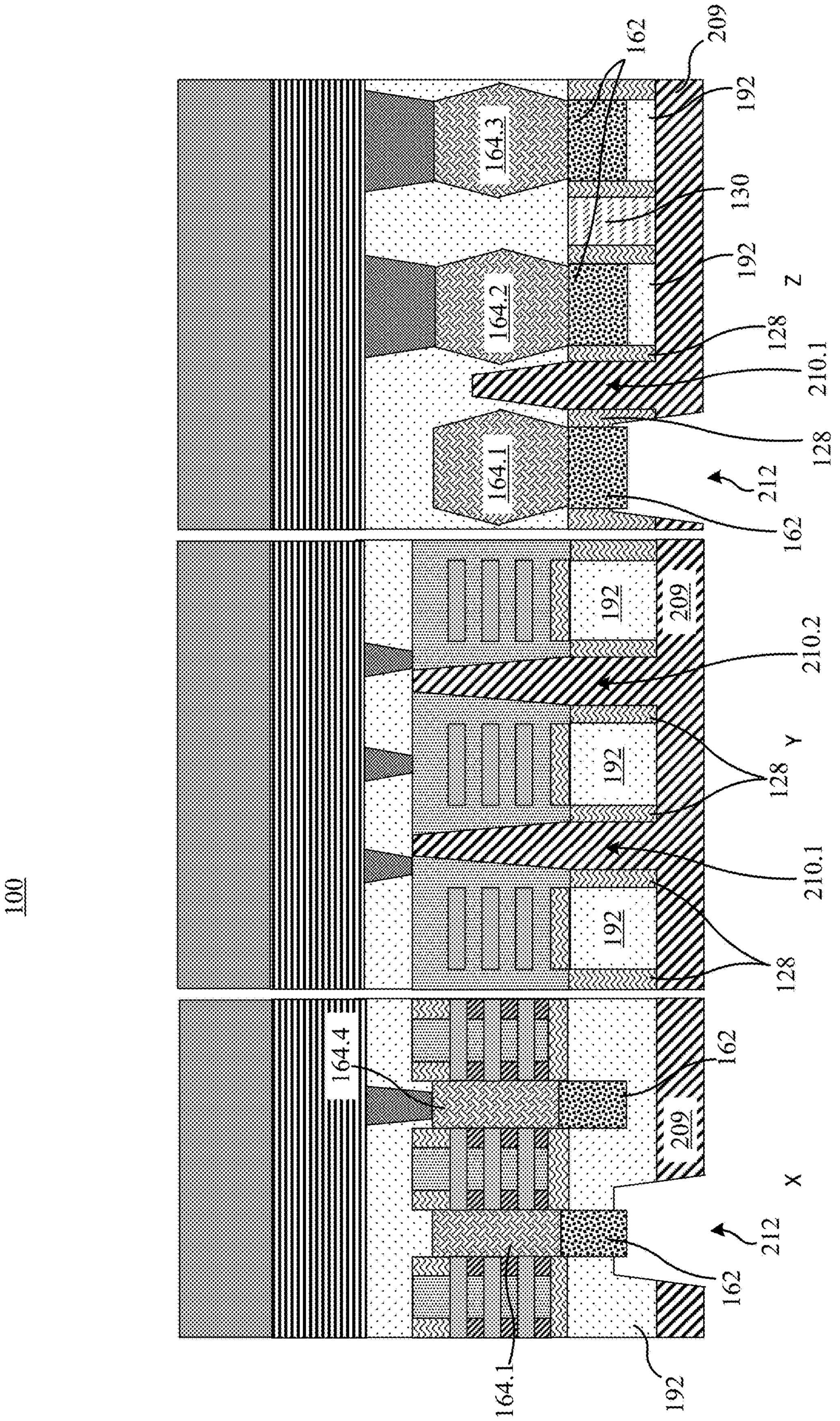

FIG. 12 depicts cross-sectional views of semiconductor IC device 100 shown after illustrative fabrication operation (s), in accordance with one or more embodiments. In the depicted fabrication stage, one or more backside contact opening(s) 212 may be formed.

The backside contact opening(s) 212 are formed from the backside of the semiconductor IC device 100 through the isolation layer 209 and partially through the ILD 192 and may expose a portion of the bottom surface and/or side surface(s) of a respective backside contact placeholder 162.

The backside contact opening(s) 212 may be formed by a subtractive removal technique, such as an etch, that removes associated portion(s) of the isolation layer 209 and partial portion(s) of the ILD 192. The etch may be timed or otherwise controlled to stop the removal of the ILD 192 such that the depth or bottom of backside contact openings 212 exposes the bottom and/or side surfaces of the associated backside contact placeholder 162.

The backside contact opening(s) 212 may be formed by the same or shared lithography and etch process, or sequential lithography and etch processes. In such process(es), a mask may be applied and patterned. An opening in the patterned mask may expose the portion of the underlying isolation layer 209 to be removed while other protected portions of semiconductor IC device 100 may be protected and retained. In such process(es), the dry and wet etching processes can have etching parameters that can be tuned, such as etchants used, etching temperature, etching solution concentration, etching pressure, source power, RF bias voltage, RF bias power, etchant flow rate, and other suitable parameters and selective materials are utilized to promote the etchant for desired material removal.

Figure 13:
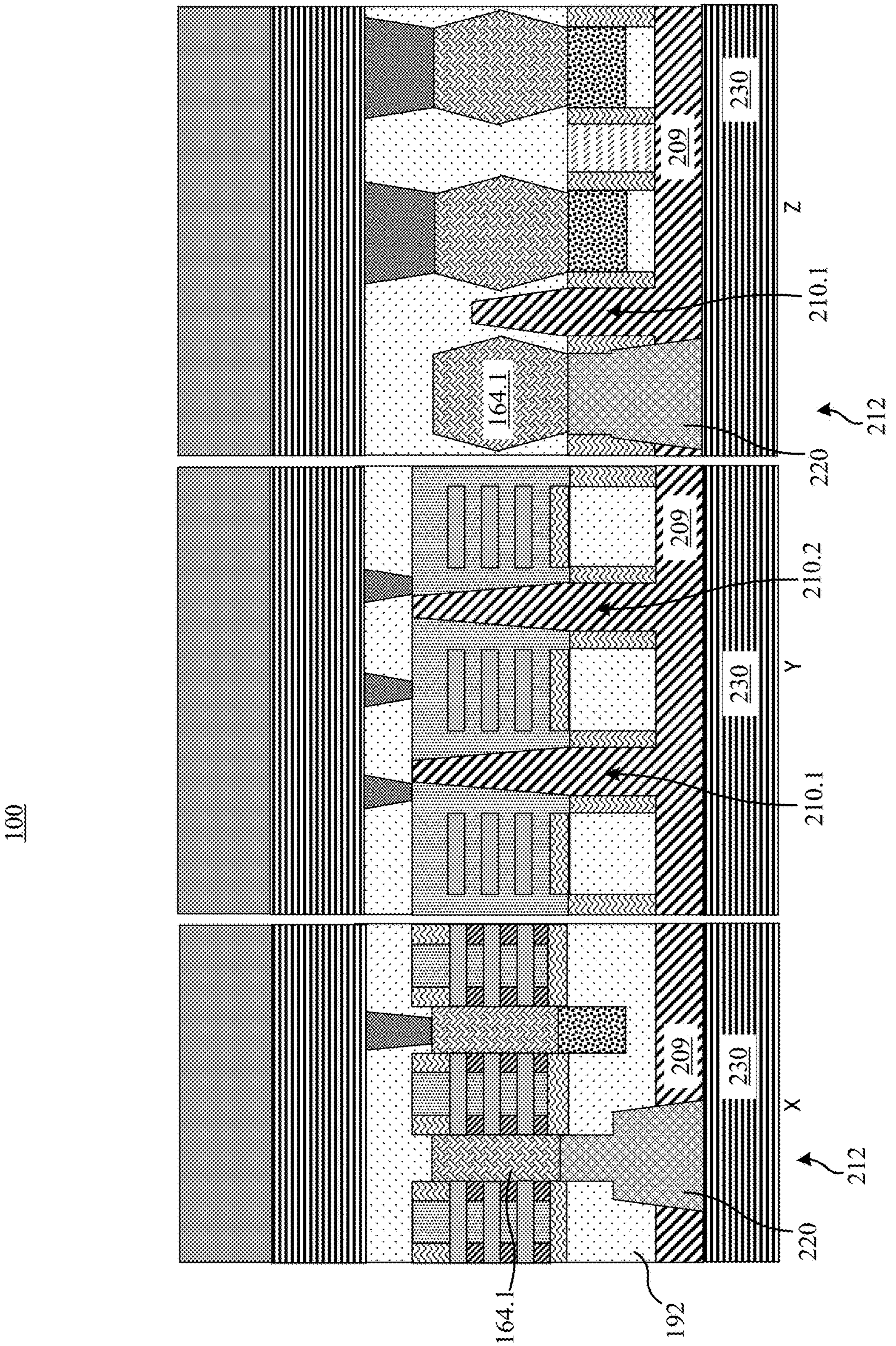

FIG. 13 depicts cross-sectional views of semiconductor IC device 100 shown after illustrative fabrication operation (s), in accordance with one or more embodiments. In the depicted fabrication stage, one or more of the backside contact placeholder(s) 162 exposed by backside contact openings 194 may be removed. Upon removal of the backside contact placeholder(s) 162 by a substrative removal technique, such as an etch, the S/D region 164 thereabove is at least partially exposed. Further, in the depicted fabrication stage, backside contact 220 may be formed. Further, in the depicted fabrication stage, a backside power distribution network (BSPDN) 230 is formed.

The backside contact 220 may be formed in contact with or melded against the exposed portion of the S/D region 164 there above. The backside contact 220 may be formed in in contact with or melded against the exposed portion of the S/D region 164.1.

The backside contact(s) 220 may be formed by depositing conductive material, such as metal into the respective backside contact openings. In an example, the backside contact(s) 220 may be formed by depositing a silicide liner, such as Ni, NiPt or Ti, etc. into the backside contact openings, depositing a metal adhesion liner, such as TiN, TaN, etc. upon the silicide liner, and by depositing a conductive metal fill, such as Al, Ru, W, Co. Cu, etc. upon the metal adhesion liner. Subsequently, a planarization process, such as a CMP process or a mechanical grinding process, may remove excess portions of the conductive barrier layer and the conductive material. Subsequently, the respective bottom surfaces (consistent with the orientation depicted in the drawings) of backside contact(s) 220 and isolation layer 209 may be coplanar.

BSPDN 230 includes metallization levels, associated metallization dielectric or passivation layers, vertical vias that connect the metallization feature(s) within the metallization levels with an underlying device or structure, or the like. BSPDN 230 may include one or more power rails, or the like, that is formed over backside contact(s) 220 making electrical contact therewith. One or more power rails within the BSPDN 230 may be connected to S/D region(s) 164.1 by one or more appropriate and associated backside contact(s) 220.

In some examples, there may be five metal levels $M_0$-$M_4$ within BSPDN 230. In some examples, there may be more than ten metal levels $M_0$-$M_x$ within BSPDN 230. In some examples, a respective backside contact 220 may contact and connect the respective S/D region 164, to a via, trace, signal line, power rail, respectively within the lowest BSPDN 230 metal level $M_0$. Generally, the BSPDN 230 are located on the backside of the semiconductor IC device 100. In one implementation, BSPDN 230 includes only power rails and frontside BEOL network 182 includes only signal lines, or vice versa. In another implantation, BSPDN 230 and frontside BEOL network 182 includes both power rails and signal lines.

Figure 14:
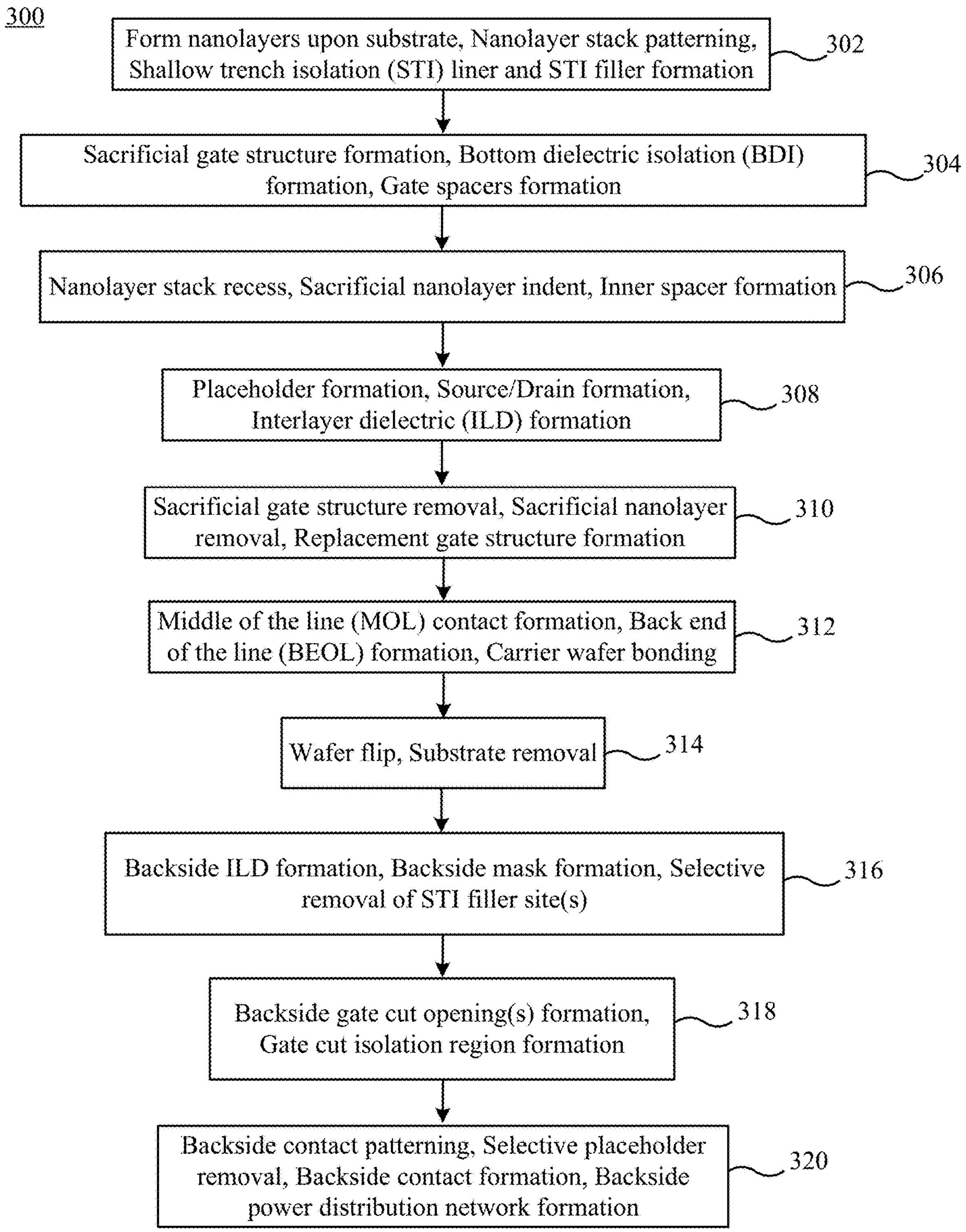
FIG. 14 depicts a flow diagram illustrating a semiconductor IC device fabrication method to fabricate a semiconductor IC device that includes a gate structure that is separated into distinct gate structures by an inverted gate cut region, in accordance with one or more embodiments of the disclosure.

FIG. 14 depicts a flow diagram illustrating method 300 to fabricate a semiconductor IC device, such as semiconductor IC device 100. The depicted fabrication operations of method 300 are illustrated and described above with reference to one or more of FIG. 2 through FIG. 13 of the drawings, which describe the fabrication of semiconductor IC device 100, though the fabrication operations described in method 300 may be used to fabricate other types of semiconductor IC devices. The method 300 depicted herein is illustrative. There can be many variations to the diagram or operations described therein without departing from the spirit of the embodiments. For instance, the operations can be performed in a differing order, or operations can be added, deleted, or modified.

At block 302, method 300 may begin with forming nanolayers upon a substrate and patterning the nanolayers into one or more nanolayer stacks. For example, method 300 may include initially forming a bottom sacrificial nanolayer 104 upon a substrate and forming alternating series of sacrificial nanolayers 106 and active nanolayers 108 thereupon. Further, method 300 may include pattering the nanolayers to form one or more nanolayer stack(s) 120 and forming STI regions therebetween. For example, predetermined portions of the nanolayers may be removed along with a well within the substrate. The portions of the nanolayers that remain may effectively form the one or more nanolayer stacks 120 and respective STI regions may be formed within the substrate well between the nanolayer stacks 120.

At block 304, method 300 may further continue with forming one or more sacrificial gate structure(s), with removing the bottom sacrificial nanolayer, with forming a bottom dielectric isolation (BDI) layer in place thereof, and with forming one or more gate spacers upon the one or more sacrificial gate structure(s). For example, method 300 may include forming one or more sacrificial gate structures 134 upon the upper substrate 112, upon the STI regions, and upon and around the nanolayer stack(s) 120. Further, method 300 may include removing the bottom sacrificial nanolayer 104. Further, method 300 may include forming BDI region 142 in place of the removed bottom sacrificial nanolayer 104 and with forming one or more gate spacer(s) 140 upon the upper substrate 102, upon the STI regions, and upon the sidewall(s) of the sacrificial gate structures 134. The BDI region(s) 142 and the gate spacer(s) 140 may be simultaneously formed. The gate spacer(s) 140 may be formed upon upper substrate 102, may be formed upon and around nanolayer stack(s) 120, and may be formed upon and around the one or more sacrificial gate structure(s) 134, respectively.

At block 306, method 300 may further continue with recessing the nanolayer stacks, with indenting the sacrificial nanolayers within the nanolayer stacks, and with forming a respective inner spacer within the recesses or indent. For example, method 300 may include forming S/D recesses 150 within the nanolayer stack(s) 120 between gate spacers 140 associated with neighboring sacrificial gate structures 134. Further, method 300 may include indenting the sacrificial nanolayers 106 within nanolayer stack(s) 120, thereby forming an indent void. Method 300 may further include forming an inner spacer 144 within a respective indent void.

At block 308, method 300 may further continue with forming one or more backside contact placeholder openings, with forming a backside contact placeholder within a respective backside contact placeholder opening, with forming one or more S/D regions, and with forming an ILD. For example, method 300 may include forming or more backside contact placeholder(s) 162 within upper substrate 102 by enlarging the S/D recesses 150 between gate spacers 140 associated with neighboring sacrificial gate structures 134 into the substrate. Further, method 300 may include forming a respective S/D region 164 upon a respective backside contact placeholder 162. Still further, method 300 may include forming ILD 176 upon S/D region(s) 164, upon upper substrate 102, and/or upon STI regions.

At block 310, method 300 may continue with removing the one or more sacrificial gate structure(s), with removing the sacrificial nanolayers, and with forming a replacement gate structure within the void or recess formed by the absence of a respective sacrificial gate structure. For example, method 300 may include removing the sacrificial gate structure(s) 134 and with removing the sacrificial nanolayers 106 and forming a respective replacement gate structure(s) 190 in place of a respective sacrificial gate structure 134.

At block 312, method 300 may continue with MOL contact formation, with frontside BEOL network formation, and with bonding a carrier wafer thereto. For example, method 300 may include forming ILD 176.1 upon the replacement gate structure(s) 190 and upon the ILD 176, and with forming respective frontside contacts 180.1, 180.2, 180.3, 180.4, 180.5, and/or 180.6 upon one or more S/D regions 164 or one or more replacement gate structures 170 Further, method 300 may include forming frontside BEOL network 182 upon the ILD 176.1 and upon the frontside contacts. Still further, method 300 may include bonding carrier wafer 184 to the frontside BEOL network 182.

At block 314, method 300 may continue with flipping the wafer assembly, with removing the substrate from the backside to expose the appropriate backside contact placeholder(s) 162. For example, method 300 may include flipping semiconductor IC device 100 using the carrier wafer 184 and removing lower substrate 101. Further, method 300 may include removing etch stop layer 103 and the upper substrate 102 to expose the BDI regions 142, to expose the backside placeholder(s) 162, and/or to expose the STI regions.

At block 316, method 300 may continue with forming a backside ILD, with forming a backside mask, and with selectively removal one or more STI filler sites. For example, ILD 192 may be formed upon the bottom surfaces (consistent with the orientation depicted in the drawings) of BDI region(s) 142, upon and around the backside contact placeholder(s) 162, and upon STI region(s). A planarizing technique, such as a CMP may remove excess ILD 192 and expose one or more sites of the STI dielectric material 130. Further, the gate cut mask 200 may be formed upon the ILD 192 and upon the STI regions. The gate cut mask 200 may be patterned by lithography and etching techniques and may expose one or more sites of the STI dielectric material 130. The exposed one or more STI dielectric material 130 sites may be removed and may expose portions of one or more replacement gate structures 170.

At block 318, method 300 may continue with forming one or more backside gate cut opening(s) and/or trench(es) within one or more replacement gate structures and with forming a respective gate cut region within the one or more backside gate cut opening(s) and/or trench(es). For example, the gate cut mask 200 and the removed one or more sites of the STI dielectric material 130 are adapted to function as a masking layer that, in conjunction with an etch of replacement gate structure(s) 170, defines one or more gate cut opening(s) 222.2 and/or the one or more gate cut trench(es) 222.1 within one or more replacement gate structure(s) 170. Subsequently, an isolation layer 209 may be formed with results in the formation of the respective gate cut region 210.1 within the one or more gate cut trench(es) 222.1 and the respective gate cut region 210.2 within the one or more gate cut opening(s) 222.2.

At block 320, method 300 may continue with forming a pattern to fabricate one or more backside contact openings, with enlarging the one or more backside contact openings by selectively removing one or more sites of the backside placeholder 162, with forming a backside contact within a respective backside contact opening, and with forming a backside power distribution network. For example, method 300 may include forming backside contact opening 212. The formation of backside contact opening 212 may expose a respective backside contact placeholder 162 which may be subsequently removed by a substrative removal technique, such as an etch. Upon removal of the backside contact placeholder 162, the S/D region 164 associated therewith is at least partially exposed. Subsequently, backside contact 220 may be formed within backside contact opening 212. The backside contact 220 may be formed in contact with or melded against the exposed portion of the S/D region 164 associated therewith. Still further, method 300 may include forming BSPDN 230 upon the isolation layer 209 and upon the backside contacts. Method 300 may further include removing the carrier wafer 184 and other subsequent fabrication stages to, for example, fabricate an IC chip, an end product, or the like.

Figure 15:
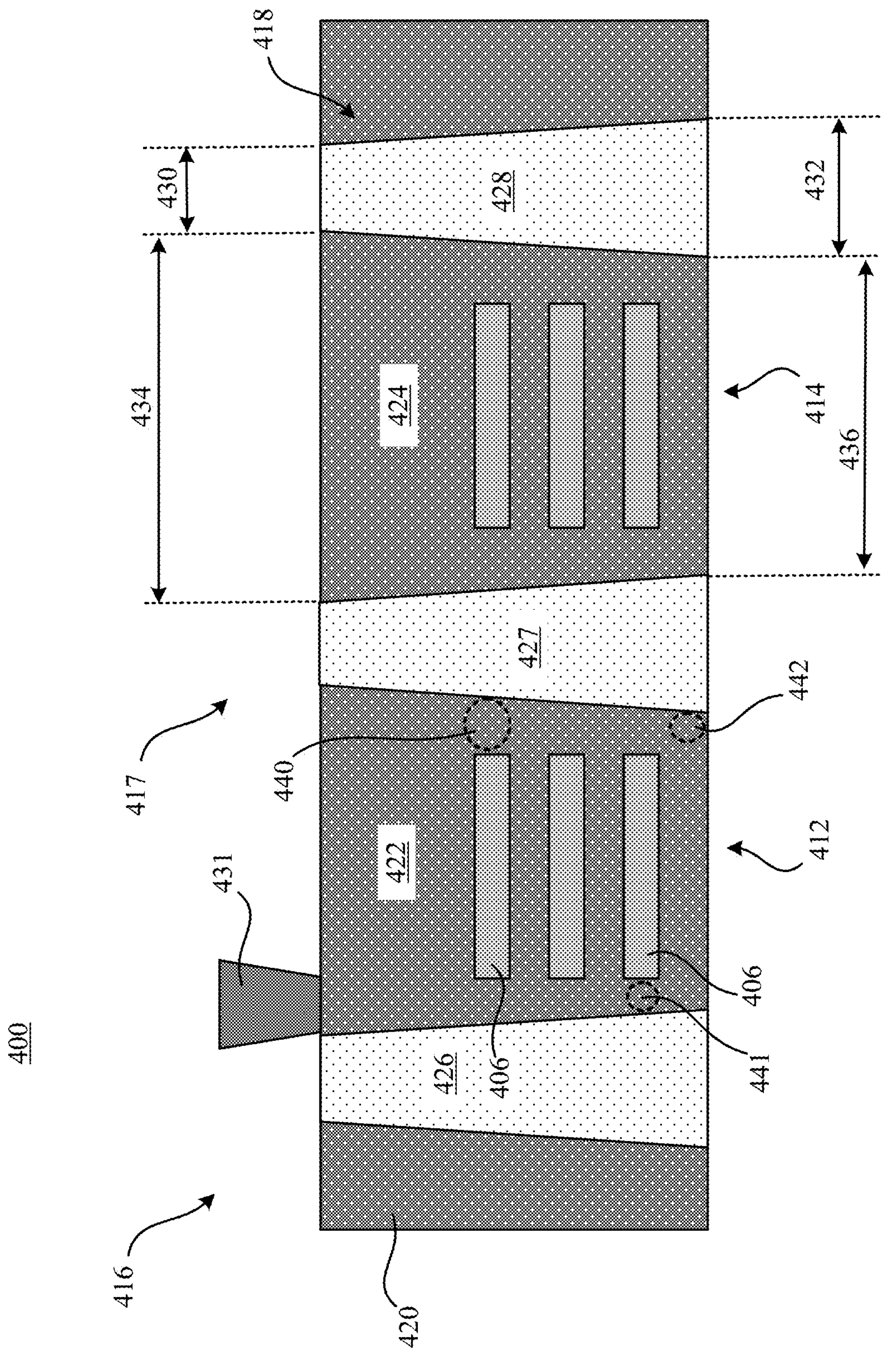
FIG. 15 depicts a gate structure that is separated into distinct gate structures by an inverted gate cut region.

Referring to FIG. 15, which depicts a semiconductor IC device 400, which may include one or more features that are the same as corresponding features of semiconductor IC device 100 (e.g., inverted gate cut regions within a gate, etc.) and may be fabricated by one or more fabrication operations of method 300. Embodiments of the present disclosure recognize that a single gate structure 420 may be separated into electrically distinct gate structures 422, 424 by the formation of one or more inverted gate cut region(s) 427, 426, and/or 428 therewithin. Gate cut regions 426, 427, and/or 428 may be formed by filling, with a dielectric or other electrically isolating material, a respective inverted gate cut opening 416, 417, and/or 418 that has been formed from the backside of the semiconductor IC device 400 within the gate structure 420.

A gate cut etch from the backside of the semiconductor IC device 400 removes the one or more portion(s) of the gate structure 420, thereby forming the inverted gate cut openings 416, 417, and/or 418. The gate cut opening 417 and the associated gate cut region 427 is located between a first active region 412 and a second active region 414 of the semiconductor IC device 400. The gate cut region 427 may be located within gate structure 420 where isolation between the active regions 412, 414 of the semiconductor IC device 400 is desired. Removing the portion of the gate structure 420, separating the first active region 412 from the second active region 414, defines two separate gate structures, i.e., a first gate structure 422 associated with the first active region 412, and a second gate structure 424 associated with the second gate structure 424, that are separated by the gate cut region 427.

The backside gate cut etch, such as an anisotropic etch, or the like, results in inverted sloped or inverted angled sidewalls of gate cut openings 416, 417, and/or 418 and gate cut regions 426, 427, and/or 428, respectively. In other words, the backside gate cut etch results in inverted gate cut regions 426, 427, and/or 428 that have a smaller top (i.e., frontside) dimension 430 compared to a bottom (i.e., backside) dimension 432. As a result, a top dimension 434 of gate structure 422 and of gate structure 424 is larger than a bottom dimension 436 of gate structure 422 and of gate structure 424.

Consequently, inverted gate cut regions result in a relatively larger top surface area of gate structure 422 and of gate structure 424 compared to a bottom surface area of gate structure 422 and of gate structure 424. As the top surface of gate structure 22 and of gate structure 24 is typically a landing area (e.g., junction or contact area) for a frontside gate contact 31, inverted gate cut regions increase the landing area of a respective frontside gate contact 431 to the gate structure 422 and to the gate structure 424. Because of the increased landing area, there is an increased propensity of the frontside gate contact 431 to be aligned to the underling gate structure 422, as depicted. Further, because of the increased landing area, there is an increased area for the frontside gate contact 431 to be located relatively further outward, as depicted, which may rectify wiring or signal routing congestion.

Further, inverted gate cut regions result in improved resistance characteristics within the gate structures 422, 424. Specifically, the inverted orientated gate cut regions result in a wide region 440 of the gate structure between a top channel 406 and the gate cut region with a relatively lower electrical resistance therethrough compared to a resistance through a narrow region 441 of the gate structure between a bottom channel 408 and the gate cut region. The benefit of the lower resistance through the wide region 440 near the top of the gate structure may allow for a reduced impedance seen by current or signals through the gate structure from the frontside contact 431. Similarly, the inverted gate cut region results in a bottom perimeter region 442 of relatively less metal or conductive material nearest the gate structure's bottom surface perimeter edge which relatively reduces the parasitic capacitance within the semiconductor IC device 400.

Figure 16:
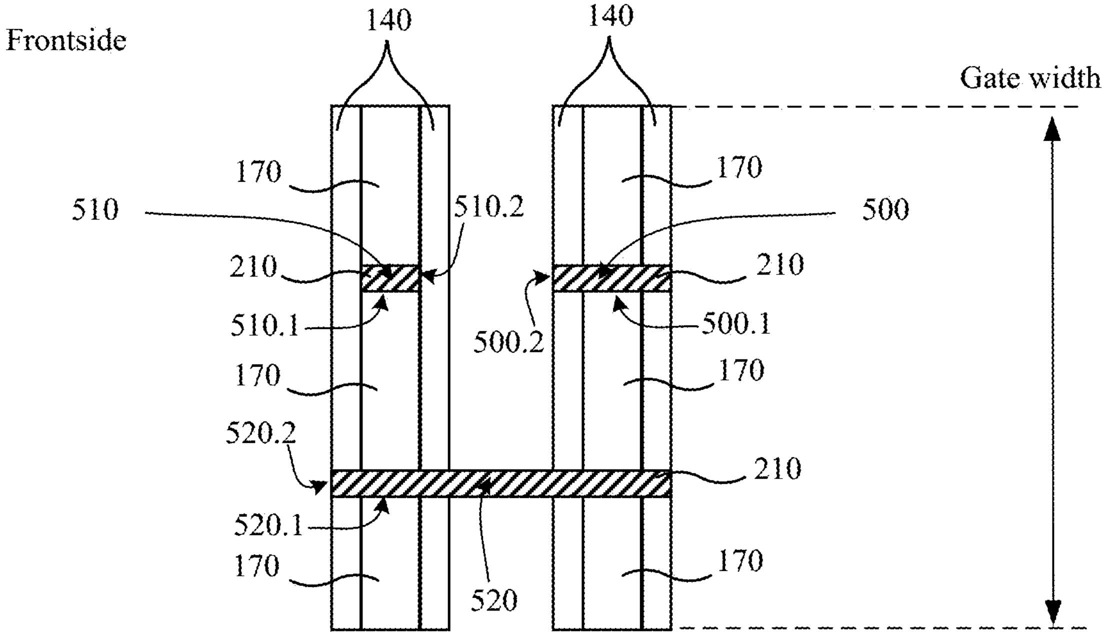
FIG. 16 depicts a frontside surface of an inverted gate cut region, in accordance with one or more embodiments of the disclosure.
Figure 17:
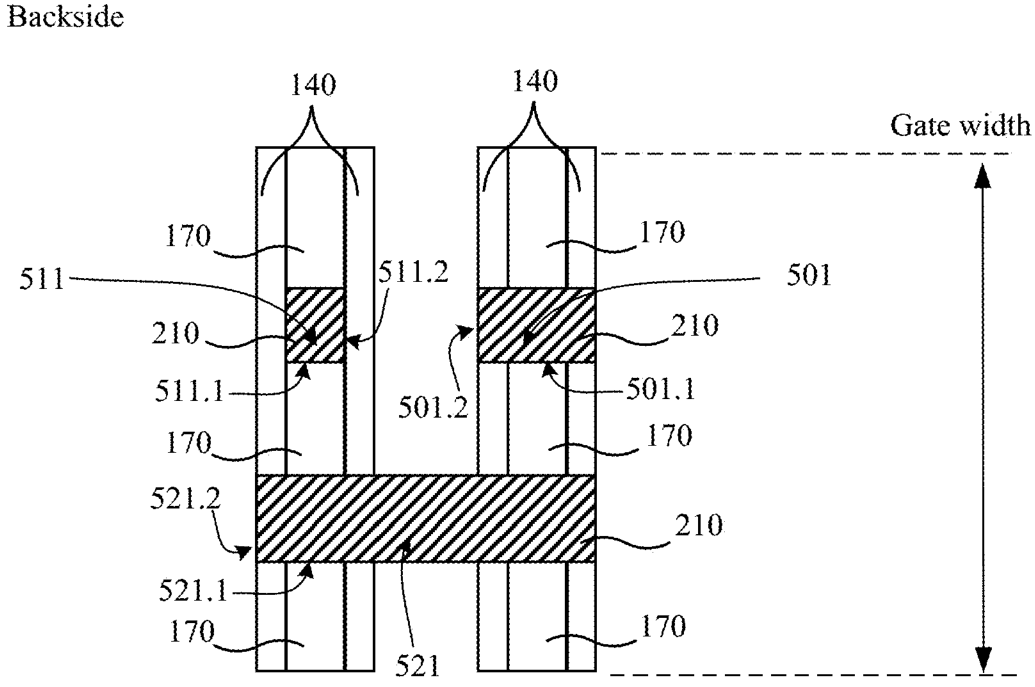
FIG. 17 depicts a backside surface of an inverted gate cut region, in accordance with one or more embodiments of the disclosure.

For clarity, FIG. 16 and FIG. 17 depict frontside and backside views of inverted gate cut regions which have relatively smaller frontside or top surface areas (i.e., FIG. 16) compared to their respective backside or bottom surface areas (i.e., FIG. 17).

Referring to FIG. 16 which depicts a frontside or top surface view of inverted gate cut regions, according to embodiment of the disclosure. As is exemplarily depicted, inverted gate cut region 210 has a frontside or top surface area 510 formed by a top surface dimension 510.1 that is orthogonal to the associated gate width and by a top surface dimension 510.2 that is parallel to the associate gate width. The top surface area 510 may be coplanar with a top surface of the associated gate or gate structure. Dimension 510.1 may be substantially the same as the associated gate length or the dimension between the inner sidewalls of the associated gate spacers 140.

Similarly, an inverted gate cut region 210 (e.g., 210.1 and/or 210.2) has a frontside or top surface area 500 formed by a top surface dimension 500.1 that is orthogonal to the associated gate width by a top surface dimension 500.2 that is parallel to the associate gate width. The top surface area 500 may be coplanar with a top surface of the associated gate or gate structure. Dimension 500.1 may be the dimension between the outer sidewalls of the associated gate spacers 340. Similarly, an inverted gate cut region 210 has a frontside or top surface area 520 formed by a top surface dimension 520.1 that is orthogonal to associated gate widths of multiple gates by a top surface dimension 520.2 that is parallel to the associate gate widths. The top surface area 520 may be coplanar with a top surface of the associated gate(s) or gate structure(s). Dimension 520.1 may be the dimension between outer sidewalls of gate spacers 140 associated with two or more different gates.

Referring to FIG. 17 which depicts a backside or bottom surface view of inverted gate cut regions, according to embodiment of the disclosure. As is exemplarily depicted, inverted gate cut region 210 has a backside or bottom surface area 511 formed by a bottom surface dimension 511.1 that is orthogonal to the associated gate width by bottom surface dimension 511.2 that is parallel to the associate gate width. The bottom surface area 511 may be coplanar with a bottom surface of the associated gate or gate structure. Dimension 511.1 may be substantially the same as dimension 510.1. Dimension 511.2 is greater than dimension 510.2. Therefore, backside or bottom surface area 511 is greater than frontside or top surface area 510.

Similarly, an inverted gate cut region 210 has a backside or bottom surface area 501 formed by a bottom surface dimension 501.1 that is orthogonal to the associated gate width by a bottom surface dimension 501.2 that is parallel to the associate gate width. The bottom surface area 501 may be coplanar with a top surface of the associated gate or gate structure. Dimension 501.1 may be substantially the same as dimension 500.1. Dimension 501.2 is greater than dimension 500.2. Therefore, backside or bottom surface area 501 is greater than frontside or top surface area 500.

Similarly, an inverted gate cut region 380 has a backside or bottom surface area 521 formed by a bottom surface dimension 521.1 that is orthogonal to associated gate widths of multiple gates by a bottom surface dimension 521.2 that is parallel to the associate gate widths. The bottom surface area 521 may be coplanar with a bottom surface of the associated gate(s) or gate structures(s). Dimension 521.1 may be substantially the same as dimension 520.2. Dimension 521.2 is greater than dimension 520.2. Therefore, backside or bottom surface area 521 is greater than frontside or top surface area 520.

The semiconductor IC devices disclosed herein may be an integrated circuit (IC) chip. IC chips can be distributed by the fabricator in raw wafer form (that is, as a single wafer that has multiple unpackaged chips), as a bare die, or in a packaged form. In the latter case, the IC chip may mount in a single chip package (such as a plastic carrier, with leads that are affixed to a motherboard or other higher-level carrier) or in a multichip package (such as a ceramic carrier that has either or both surface interconnections or buried interconnections). In any case, the IC chip may be integrated with other chips, discrete circuit elements, and/or other signal processing devices as part of either (a) an intermediate product, such as a motherboard, or (b) an end product. The end product can be any product that includes the IC chip, ranging from toys and other low-end applications to advanced computer products having a display, a keyboard or other input device, and a central processor.

The descriptions of the various embodiments of the present disclosure have been presented for purposes of illustration but are not intended to be exhaustive or limited to the embodiments described. Many modifications and variations will be apparent to those of ordinary skill in the art without departing from the scope and spirit of the disclosure. The terminology used herein was chosen to best explain the principles of the embodiment, the practical application or technical improvement over technologies found in the marketplace, or to enable others of ordinary skill in the art to understand the embodiments described herein.

Various embodiments of the present disclosure are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" upon layer "B" include situations in which one or more intermediate layers (e.g., layer "C") is between layer "A" and layer "B" as long as the relevant characteristics and functionalities of layer "A" and layer "B" are not substantially changed by the intermediate layer(s).

For purposes of the description hereinafter, the terms "upper," "lower," "right," "left," "vertical," "horizontal," "top," "bottom," and derivatives thereof relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element.

The terms "about," "substantially," "approximately," and variations thereof, are intended to include the degree of error associated with measurement of the particular quantity based upon the equipment available at the time of filing the application. For example, substantial coplanarity between various materials can include an appropriate manufacturing tolerance of about ±8%, ±5%, ±2%, or the like, difference between the coplanar materials.

As used herein, the term "coplanar" refers to two surfaces that lie in a common plane. In other words, two surfaces are coplanar if there exists a geometric plane that contains all of the points of both of the surfaces. As used herein, the term "substantially" refers to an extent to which minor deviations are included such that the deviations do not impact the desired result. Accordingly, two surfaces may be referred to as substantially coplanar despite deviations from coplanarity on an atomic scale, so long as those deviations do not impact the desired result of the coplanarity.

What is claimed is:

1. A semiconductor integrated circuit (IC) device comprising:

a gate structure between a first gate spacer and a second gate spacer, the gate structure comprising a first gate and a second gate, wherein the first gate comprises a frontside contact landing area that is greater than a bottom surface area of the first gate; and a backside isolation layer that comprises an inverted gate cut region that separates the first gate from the second gate, wherein the inverted gate cut region comprises a bottom surface area and a top surface area that is smaller than the bottom surface area of the inverted gate cut region.

2. The semiconductor IC device of claim 1, wherein the inverted gate cut region is further located between a first source/drain (S/D) region and a second S/D region.

3. The semiconductor IC device of claim 2, further comprising:

a backside contact within the backside isolation layer and in contact with the first S/D region.

4. The semiconductor IC device of claim 1, further comprising:

a first transistor that comprises the first gate, the first transistor further comprising a top channel that is vertically above a bottom channel.

5. The semiconductor IC device of claim 4, wherein a top dimension between the top channel and the inverted gate cut region is greater than a bottom dimension between the bottom channel and the inverted gate cut region.

6. The semiconductor IC device of claim 1, wherein the gate structure is a replacement gate structure.

7. The semiconductor IC device of claim 1, wherein the backside isolation layer comprises a backside gate contact within a backside contact opening.

8. A semiconductor integrated circuit (IC) device comprising:

a gate structure between a first gate spacer and a second gate spacer, the gate structure comprising a first gate and a second gate, wherein the first gate comprises a frontside contact landing area that is greater than a bottom surface area of the first gate; and a backside isolation layer that comprises an inverted gate cut region that separates the first gate from the second gate and comprises a bottom dimension and a top dimension that is smaller than the bottom dimension.

9. The semiconductor IC device of claim 8, wherein the inverted gate cut region is further located between a first source/drain (S/D) region and a second S/D region.

10. The semiconductor IC device of claim 9, further comprising:

a backside contact within the backside isolation layer in contact with the first S/D region.

11. The semiconductor IC device of claim 8, further comprising:

a first transistor associated with the first gate, the first transistor comprising a top channel that is vertically above a bottom channel.

12. The semiconductor IC device of claim 11, wherein a top distance between the top channel and the inverted gate cut region is greater than a bottom distance between the bottom channel and the inverted gate cut region.

13. The semiconductor IC device of claim 8, wherein the gate structure is a replacement gate structure.

14. A method to fabricate a semiconductor integrated circuit (IC) device comprising:

forming a gate structure;

forming an inverted gate cut opening by etching, from a backside of the semiconductor IC device, within the gate structure; and forming an inverted gate cut region within the inverted gate cut opening, the inverted gate cut region separating the gate structure into a first gate and a second gate, wherein the first gate comprises a frontside contact landing area that is greater than a bottom surface area of the first gate.

15. The method of claim 14, wherein forming the inverted gate cut region within the inverted gate cut opening comprises:

depositing a dielectric material upon the backside of the semiconductor IC device and within the inverted gate cut opening.

16. The method of claim 14, further comprising:

forming a first transistor associated with the first gate, the first transistor comprising a top channel that is vertically above a bottom channel.

17. The method of claim 16, wherein a top distance between the top channel and the inverted gate cut region is greater than a bottom distance between the bottom channel and the inverted gate cut region.

18. The method of claim 14, wherein the gate structure is a replacement gate structure.

19. The method of claim 14, wherein the inverted gate cut region is further located between a first source/drain (S/D) region and a second S/D region.

20. The method of claim 14, wherein the backside isolation layer comprises a backside gate contact within a backside contact opening.

* * * * *